(12) United States Patent
Yang et al.

(10) Patent No.: US 10,275,081 B2
(45) Date of Patent: Apr. 30, 2019

(54) REFRIGERATOR INCLUDING TOUCH SENSOR

(71) Applicant: LG ELECTRONICS INC., Seoul (KR)

(72) Inventors: Jae Sung Yang, Seoul (KR); Hyun Ki Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 15/662,598

(22) Filed: Jul. 28, 2017

(65) Prior Publication Data

US 2018/0164945 A1    Jun. 14, 2018

(30) Foreign Application Priority Data

Aug. 31, 2016    (KR) .......................... 10-2016-0112173

(51) Int. Cl.
*F25D 23/02*  (2006.01)
*F25D 29/00*  (2006.01)
(Continued)

(52) U.S. Cl.
CPC ......... *G06F 3/0416* (2013.01); *F25D 23/028* (2013.01); *F25D 29/005* (2013.01);
(Continued)

(58) Field of Classification Search
CPC ................ F25D 23/02; F25D 2400/36; F25D 2400/361; G06F 3/016; G06F 3/0412;
(Continued)

(56) References Cited

U.S. PATENT DOCUMENTS 4,938,027 A * 7/1990 Midlang .............. F25D 21/008
                                                               62/153
6,265,682 B1 * 7/2001 Lee ...................... H03K 17/962
                                                               200/600
(Continued)

FOREIGN PATENT DOCUMENTS

EP         3037758        6/2016
EP         3043475        7/2016
(Continued)

OTHER PUBLICATIONS

Thomas, Roland E. et al., Circuits and Signals, Wiley 1984, pp. 140-177, 597-601 (Year: 1984).*

(Continued)

*Primary Examiner* — Michael J Eurice
(74) *Attorney, Agent, or Firm* — Fish & Richardson P.C.

(57) ABSTRACT

A refrigerator includes a door that has a front panel with an operation area to receive a touch operation of a user, a touch sensor assembly that is located rearward of the operation area and that includes sensors to generate an input signal based on the touch operation, and a sensor controller connected to the touch sensor assembly and configured to process the input signal received from the touch sensor assembly. The sensor controller is configured to determine whether the touch operation is a push operation or a release operation based on comparison of a voltage value of the processed input signal to predetermined first and second threshold voltage values.

18 Claims, 31 Drawing Sheets

(51) Int. Cl.
*G06F 3/01* (2006.01)
*H03K 17/96* (2006.01)
*G06F 3/041* (2006.01)
*G06F 3/0488* (2013.01)

(52) U.S. Cl.
CPC ....... *G06F 3/0488* (2013.01); *H03K 17/9643* (2013.01); *H03K 17/9647* (2013.01); *F25D 2400/361* (2013.01); *H03K 2217/96015* (2013.01)

(58) Field of Classification Search
CPC ................ G06F 3/0414; G06F 3/0416; G06F 2203/014; G06F 2203/04103
See application file for complete search history.

(56) References Cited

U.S. PATENT DOCUMENTS

| | | | | |
|---|---|---|---|---|
| 6,813,896 | B1* | 11/2004 | Janke | F25D 25/02 62/126 |
| 9,306,561 | B2* | 4/2016 | Caldwell | A47B 57/00 |
| 2001/0010516 | A1* | 8/2001 | Roh | F25D 29/00 345/169 |
| 2002/0066279 | A1* | 6/2002 | Kiyomatsu | F25D 29/00 62/125 |
| 2004/0154318 | A1* | 8/2004 | Roh | F25D 29/00 62/126 |
| 2006/0144056 | A1* | 7/2006 | Oh | F25D 29/005 62/126 |
| 2006/0261220 | A1* | 11/2006 | Lee | F16M 13/02 248/27.1 |
| 2008/0007520 | A1* | 1/2008 | Lee | F25D 29/00 345/156 |
| 2008/0047287 | A1* | 2/2008 | Ruppert | F25D 29/00 62/256 |
| 2008/0130203 | A1* | 6/2008 | Doberstein | F25D 29/005 361/601 |
| 2009/0241589 | A1* | 10/2009 | Yoo | F25D 25/025 62/449 |
| 2010/0252408 | A1* | 10/2010 | Yamauchi | H03K 17/962 200/600 |
| 2012/0267964 | A1* | 10/2012 | Caldwell | A47B 57/00 307/112 |
| 2013/0036755 | A1* | 2/2013 | Kang | B01L 1/50 62/129 |
| 2013/0067940 | A1* | 3/2013 | Shim | F25B 49/005 62/125 |
| 2014/0144083 | A1* | 5/2014 | Artwohl | A47F 3/0434 49/70 |
| 2014/0165613 | A1* | 6/2014 | Waugh | F25D 29/00 62/56 |
| 2015/0097791 | A1* | 4/2015 | Lisseman | B62D 1/04 345/173 |
| 2015/0160727 | A1* | 6/2015 | Shinozaki | G06F 3/0488 340/407.2 |
| 2015/0260449 | A1* | 9/2015 | Furuta | G09B 19/0092 62/125 |
| 2015/0276302 | A1* | 10/2015 | Roh | G02F 1/133377 62/56 |
| 2016/0162715 | A1* | 6/2016 | Luk | F25D 29/005 235/385 |
| 2016/0178277 | A1* | 6/2016 | Park | F25D 29/005 345/173 |
| 2016/0188025 | A1* | 6/2016 | Park | G06F 3/041 52/784.15 |
| 2016/0188093 | A1* | 6/2016 | Kim | F25D 29/005 345/173 |
| 2017/0051966 | A1* | 2/2017 | Powell | F25D 23/04 |
| 2017/0089632 | A1* | 3/2017 | Kang | G09F 9/35 |

FOREIGN PATENT DOCUMENTS

| | | |
|---|---|---|
| JP | 4082402 | 5/2006 |
| JP | 2009232152 | 10/2009 |
| KR | 101639522 | 7/2016 |

OTHER PUBLICATIONS

Extended European Search Report in European Application No. 17187234.4, dated Dec. 21, 2017, 10 pages.

* cited by examiner

750

750

REFRIGERATOR INCLUDING TOUCH SENSOR

CROSS-REFERENCE TO RELATED APPLICATION

This application claims priority to and the benefit of Korean Patent Application No. 10-2016-0112173, filed on Aug. 31, 2016, the disclosure of which is incorporated herein by reference in its entirety.

FIELD

The present disclosure relates to a refrigerator including a touch sensor.

BACKGROUND

A refrigerator is an apparatus that can keep objects such as food and beverage fresh by cooling its freezing compartment or refrigerating compartment to a temperature through repeated freezing or refrigerating cycles. For example, a refrigerator includes a body that defines a storage space and a door that opens and closes the storage space. The storage space may store items such as food, and a user may open the door to store items or to withdraw stored items.

Recently, demand for additional functions of refrigerators in addition to the above-described basic functions are increasing. For example, a door of the refrigerator may include an interface that can display various pieces of information related to a refrigerator such as information about controlling the refrigerator and information about items stored in the refrigerator to allow a user to perform operations for changing the information or for controlling the refrigerator.

In some examples, operations for controlling a refrigerator have been performed through an interface including physical buttons. Recently, some refrigerators include a touch interface. The touch interface may have advantages of having a high response speed and improved aesthetics, compared to the physical buttons.

Touch interfaces may be classified into capacitive touch interfaces driven by sensing static electricity generated at a human body and resistive touch interfaces driven by sensing a pressure applied to a sensor. Among them, resistive touch interfaces may be manufactured at a relatively low price compared with capacitive touch interfaces and have an advantage in case an exterior member of a refrigerator is made of metal.

The above-described resistive touch interface generates input signals at different levels depending on intensities of pressure applied to a touch sensor by a user. However, in some cases, due to low-level voltages of the input signals, it may be difficult to sense a touch operation of the user.

To perform more precise controlling of a refrigerator including a touch interface, it may be necessary to sense each of a push operation in which a user pushes an operation area and a release operation in which the user takes a finger away from the operation area that has been pushed by the user. However, in some related examples, refrigerators having a resistive touch interface may sense only one of a push operation and a release operation. In these cases, a sensing speed and a response speed with respect to a touch operation of a user may be insufficient.

SUMMARY

One aspect of the present disclosure is to provide a refrigerator capable of increasing the sensitivity of a touch sensor by amplifying a level of an input signal generated according to a degree of applying a pressure to the touch sensor and performing more precise control.

Another aspect of the present disclosure is to provide a refrigerator capable of increasing a sensing speed of a touch operation of a user and a response speed of the touch operation by sensing both an operation in which the user pushes an operation area (a push operation) and an operation in which the user takes away a finger from the pushed operation area (a release operation).

Aspects of the present disclosure are not limited to the above-described aspects and other aspects and advantages of the present disclosure will be understood by the following description and will be more definitely understood through implementations of the present disclosure. In some implementations, it will be easily appreciated that the aspects and advantages of the present disclosure may be implemented by structures shown in the claims and a combination thereof.

As described above, a resistive touch interface generates input signals at different levels according to levels of pressure applied to a touch sensor by a user. However, in some cases, due to low-level voltages of the input signals, it may be difficult to sense a touch operation of the user. For example, if a difference between a voltage value of the input signal before the user applies a pressure to the touch sensor and a voltage value of the input signal after the user applies a pressure to the touch sensor is not great, a case in which a touch operation is not be sensed may occur.

To improve the above-described limitation, an input signal input from a touch sensor is amplified using an amplification circuit. When the input signal is amplified as described above, since a difference between a voltage value of the input signal before the user applies a pressure to the touch sensor and a voltage value of the input signal after the user applies the pressure to the touch sensor can be increased, it may be possible to more precisely sense a touch operation.

In some related cases, refrigerators having a resistive touch interface may sense only one of a push operation and a release operation. For example, in the resistive touch interfaces, during a series of operations in which a user pushes a touch sensor with a finger and then removes the finger from the touch sensor, an operation in which the user pushes the touch sensor (a push operation) is not sensed and only an operation in which the user removes the finger from the touch sensor (a release operation) is sensed.

In some implementations, both the push operation and the release operation may be sensed using a sensor controller. To sense both the push operation and release operation as described above, the amplification circuit may output a predetermined reference voltage value when there is no input signal transmitted from the sensor. To output the above-described reference voltage value, the amplification circuit may have a configuration different from a conventional amplification circuit.

According to another aspect of the subject matter described in this application, a refrigerator includes: a door including a front panel that defines at least a portion of an exterior of the refrigerator, the front panel including an operation area configured to receive a touch operation of a user; a touch sensor assembly located in the door rearward of the operation area, the touch sensor assembly including a plurality of sensors and being configured to generate an input signal based on the touch operation; and a sensor controller connected to the touch sensor assembly and configured to process the input signal received from the touch sensor assembly. The sensor controller is configured to determine that the touch operation is a push operation based on determination that a voltage value of the processed input signal is less than or equal to a predetermined first threshold voltage value. The sensor controller is configured to determine that the touch operation is a release operation based on determination that the voltage value of the processed input signal is greater than or equal to a predetermined second threshold voltage value.

Implementations according to this aspect may include one or more of following features. For example, the sensor controller may include an amplification circuit configured to receive the input signal from the touch sensor assembly and amplify the input signal by a predetermined amplification ratio. The amplification circuit may be configured to output a predetermined reference operation voltage value based on receiving no input signal from the touch sensor assembly. The reference operation voltage value may be greater than zero Volts. In some examples, the amplification circuit may be configured to, based on a sensor of the plurality of sensors receiving a pressure from the operation area, output a first voltage value that is less than the reference operation voltage value. The amplification circuit may be configured to, based on the sensor being released from the pressure, output a second voltage value greater than the reference operation voltage value.

In some implementations, the reference operation voltage value may be an average value of the first and second threshold voltage values. The first threshold voltage value may be less than the second threshold voltage value. The amplification circuit may include a differential amplifier, a first resistor connected to a positive terminal of the differential amplifier, a second resistor connected to an output terminal of the differential amplifier and a negative terminal of the differential amplifier, a third resistor connected to the negative terminal of the differential amplifier and a reference power supply, and a fourth resistor having one end connected to a first point between the first resistor and the positive terminal and the other end connected to a second point between the reference power supply and the third resistor. A ratio of resistance values of the second and third resistors may determine the predetermined amplification ratio of the amplification circuit. A ratio of resistance values of the first and fourth third resistors may equal to a ratio of resistance values of the third and second resistors. The fourth resistor may determine the predetermined reference operation voltage value based on the sensor controller receiving no input signal from the touch sensor assembly.

In some implementations, the sensor controller may further include a voltage follower circuit that is connected to the first resistor of the amplification circuit, that is configured to receive the input signal through a positive terminal of the voltage follower circuit, and that is configured to transmit the input signal to the amplification circuit through an output terminal of the voltage follower circuit. The output terminal of the voltage follower circuit is connected to a negative terminal of the voltage follower circuit. In some examples, the sensor controller may further include a filtering circuit that is connected to the output terminal of the differential amplifier and that is configured to attenuate a noise signal from the amplified input signal. The filtering circuit may include a fifth resistor that is connected to the output terminal of the differential amplifier and a capacitor connected to the fifth resistor and a ground terminal.

In some implementations, the sensor controller may include a voltage follower circuit configured to amplify power of the input signal. The voltage follower circuit may be configured to amplify a current value of the input signal and to maintain a voltage value of the input signal. In some examples, each sensor of the plurality of sensors may include a piezoelectric member configured to deform to generate the input signal based on the touch operation. The piezoelectric member may be configured to increase a voltage level of the input signal based on an increase of compression and elongation of the piezoelectric member. The piezoelectric member may be configured to decrease the voltage level of the input signal based on a decrease of compression and elongation of the piezoelectric member.

DETAILED DESCRIPTION

Figure 1:
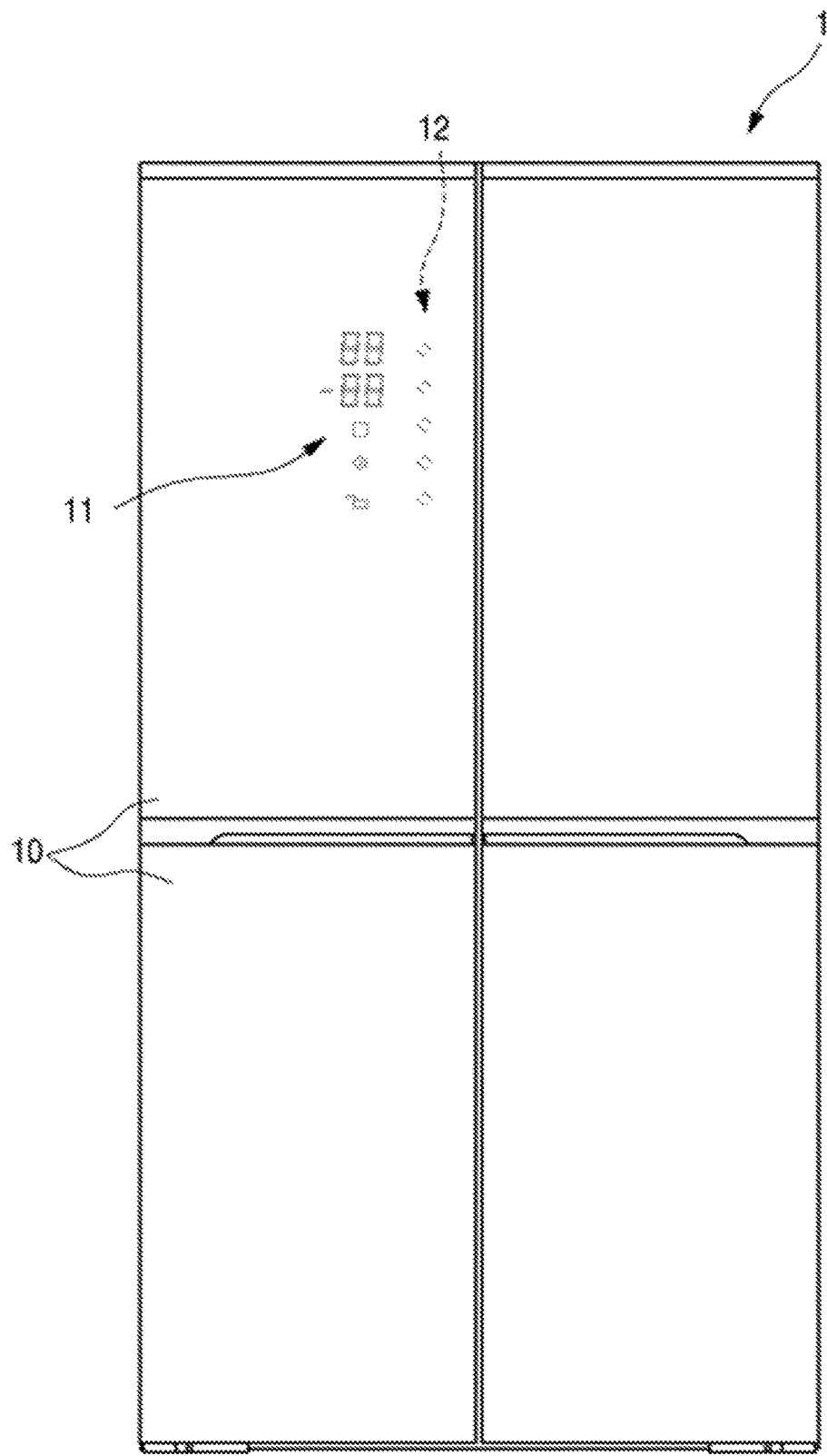
FIG. 1 is a front view showing an example refrigerator.

The above-described objects, features, and advantages will be described below in detail with reference to the attached drawings to allow one of ordinary skill in the art to easily execute the technical concept of the present disclosure. In the description of the implementations of the present disclosure, a certain detailed explanation of a well-known function or component of the related art will be omitted when it is deemed that it may unnecessarily obscure the essence of the present disclosure. Hereinafter, exemplary implementations of the present disclosure will be described in detail with reference to the attached drawings. Throughout the drawings, like reference numerals refer to like or similar elements.

For convenience of description, the implementations of the present disclosure will be described with a side-by-side type refrigerator as an example. However, the present disclosure is applicable to not only other types of refrigerators in addition to the side-by-side type refrigerator but also other electronic devices to which a touch interface is applicable.

FIG. 1 is a front view showing an example refrigerator.

As shown in FIG. 1, an external shape of an example refrigerator 1 may be formed by a cabinet that forms a storage space and a refrigerator door 10 mounted on the cabinet to open and close the storage space.

The storage space may be divided into left and right sides and/or top and bottom, and a plurality of such refrigerator doors 10 that open and close each space may be provided at an open front side of the storage space. The refrigerator door 10 may be configured to slidably or rotatably open and close the storage space and may define a front external shape of the refrigerator 1 in a closed state.

In some examples, a display area 11 and an operation area are provided at heights that allow a user to easily operate and appreciate at the refrigerator door 10 on one side among the plurality of refrigerator doors 10.

The display area 11 is an area for externally displaying an operation state of the refrigerator 1 and through which light emitted from the inside of the refrigerator door 10 passes and which displays a sign or a number to allow the user to check from the outside. Here, the display area 11 may be defined including a hole and a transparent part through which light is passable.

The operation area is a part including a plurality of touch portions 12 which the user touches for operating the refrigerator 1, is provided in a partial area of the front side of the refrigerator door 10, and includes a part for sensing a push operation which may be formed using various methods including surface processing such as printing and etching or light transmission.

Figure 2:
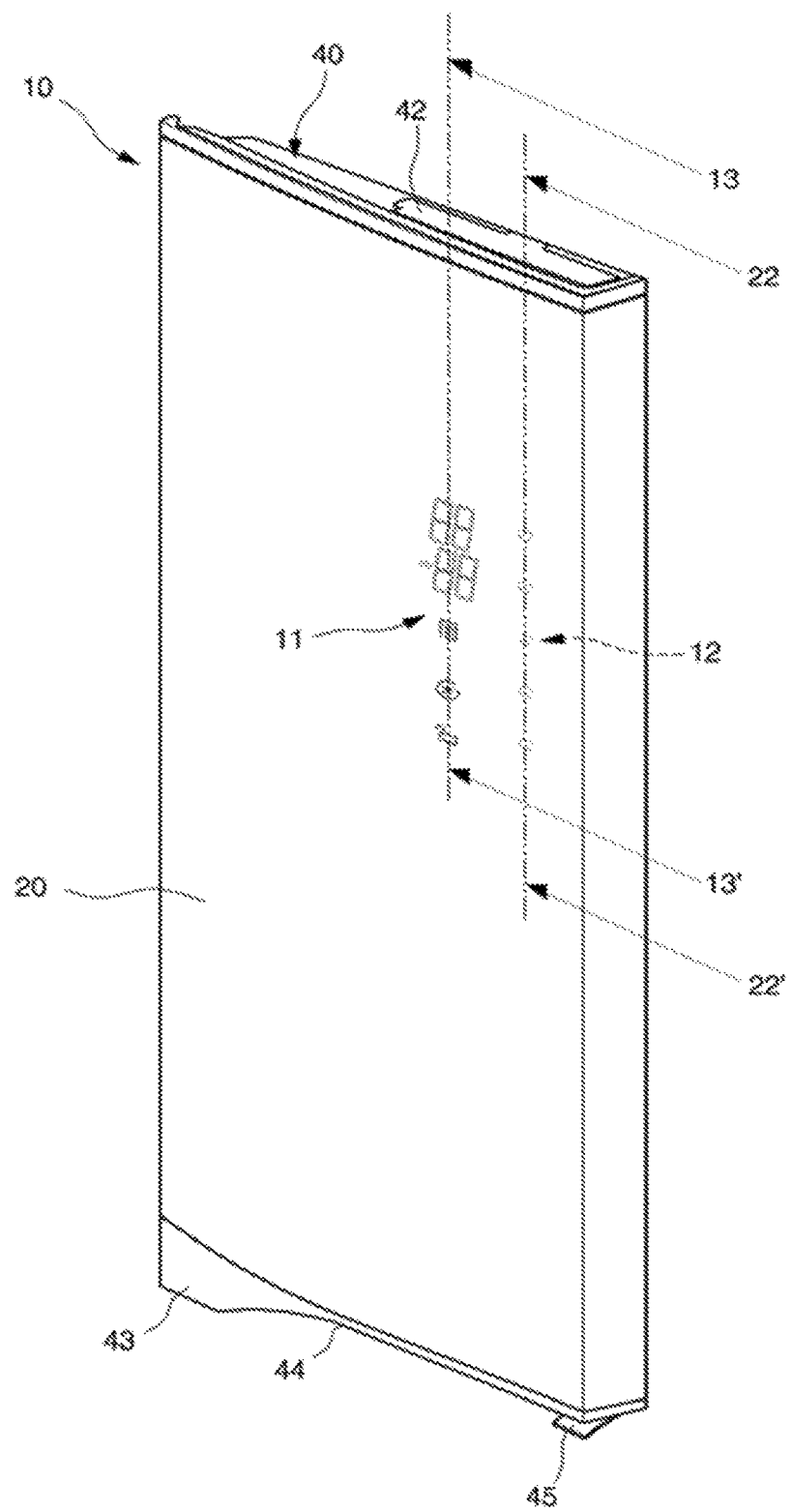
FIG. 2 is a perspective view showing an example refrigerator door.
Figure 3:
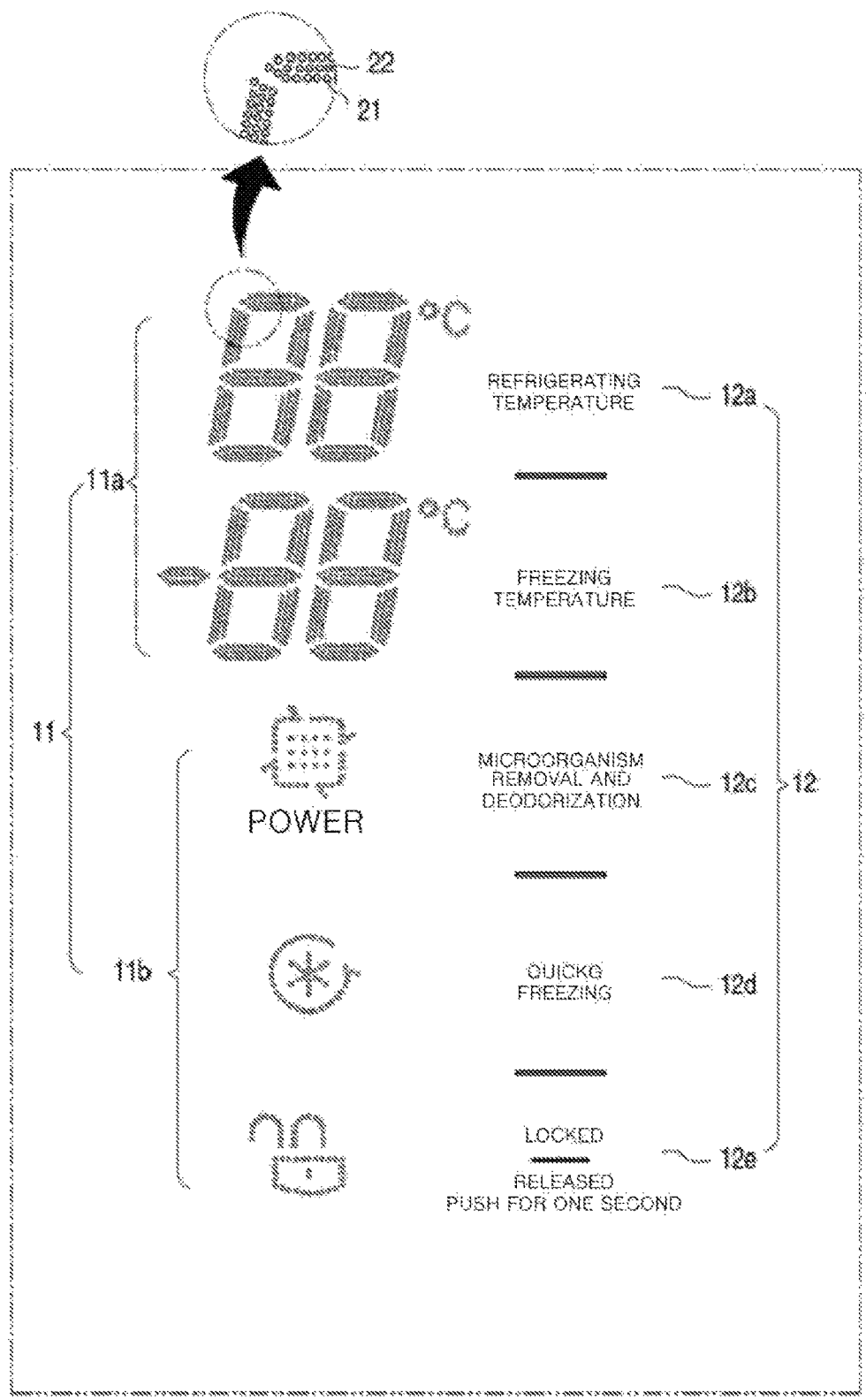
FIG. 3 is a view illustrating an example display area and an example operation area of the refrigerator door.
Figure 4:
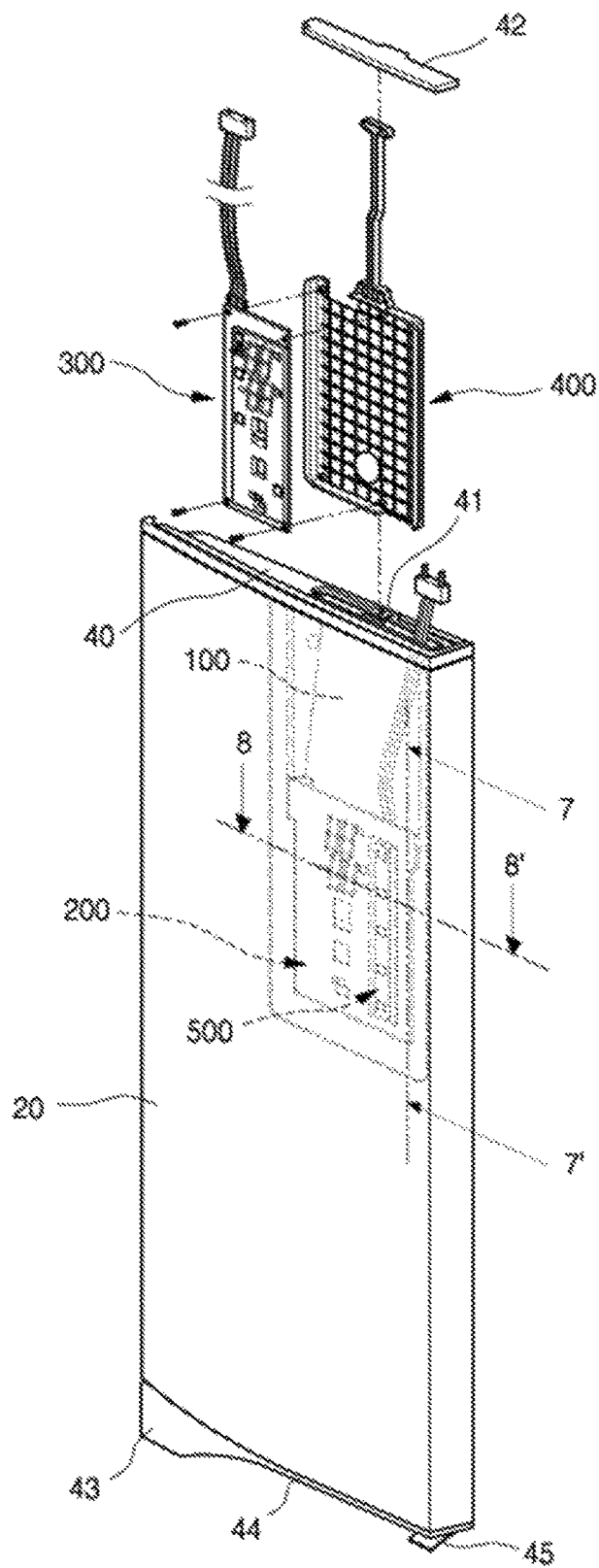
FIG. 4 is an exploded perspective view illustrating an example mounting structure of an example display assembly of the refrigerator door.
Figure 5:
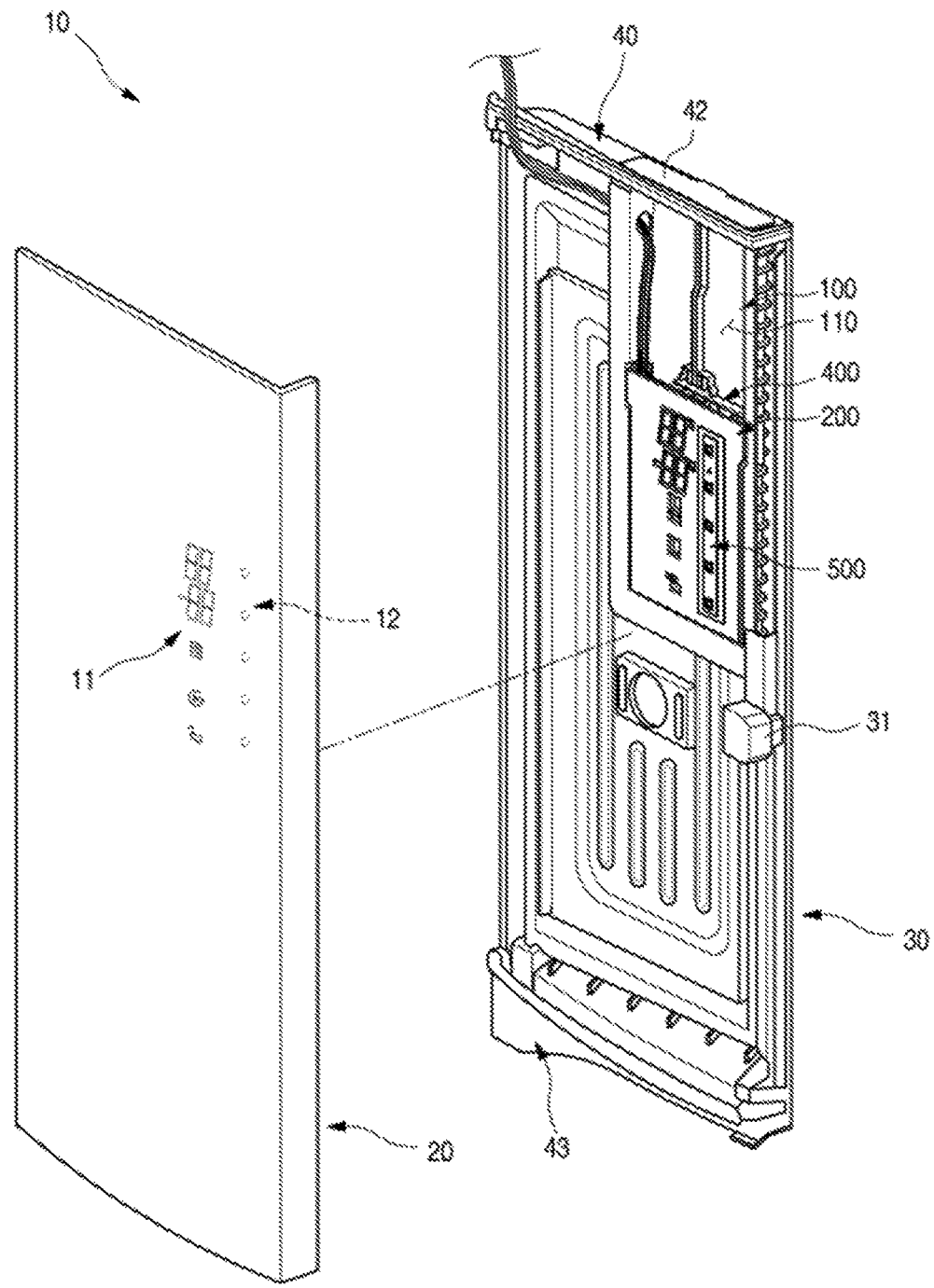
FIG. 5 is an exploded perspective view illustrating an example front panel that is separated from the refrigerator door.

FIG. 2 is a perspective view of an example refrigerator door, FIG. 3 is a view illustrating a display area and an example operation area of the refrigerator door, FIG. 4 is an exploded perspective view illustrating an example mounting structure of an example display assembly of the refrigerator door, and FIG. 5 is an exploded perspective view illustrating an example front panel that is separated from the refrigerator door.

As shown in the drawings, an overall external shape of the refrigerator door 10 includes a front panel 20 that forms an external shape overall, decorative members 40 and 43 provided at a top end and a bottom end of the front panel 20, and a door liner 30 that forms a rear external shape of the refrigerator door 10.

In more detail, the front panel 20 forms a front external shape of the refrigerator door 10 and may be formed of stainless steel in a planar shape. In some implementations, the front panel 20 is a component that forms at least a part of the external shape of the refrigerator door 10 and may be referred to as an exterior member in other home appliances that are not refrigerators.

The front panel 20 may be formed of a metal or a material having texture like metal instead of stainless steel and may be formed of a glass or plastic material as necessary.

The front panel 20 may form not only a front surface of the refrigerator door 10 but also a part of a side surface of the refrigerator door 10 as necessary and a fingerprint prevention treatment or hairline processing may be further performed on a surface of the front panel 20.

In some implementations, the display area 11 may be defined by a plurality of first through holes 21 arranged in a partial area of the front panel 20. The display area 11 may form a number display portion 11a that displays numbers and a sign display portion 11b that displays signs, letters, or figures using sets of the plurality of first through holes 21 perforated in a certain arrangement.

For example, the number display portion 11a may be formed by arranging the set of the plurality of first through holes 21 in a seven-segment shape. The number display portion 11a may be provided at each of top and bottom to independently display temperatures of a refrigerating compartment and a freezing compartment. The number display portion 11a may display another piece of information displayable as numbers in addition to temperature information, and different pieces of information may be selectively displayed by operating an operation area.

In some implementations, the sign display portion 11b may be formed below the number display portion 11a. The sign display portion 11b may display an operation state of the refrigerator 1 as a sign or a figure and is formed by arranging the set of the first through holes 21 in a shape corresponding thereto to allow the user to intuitionally know it.

For example, among the sign display portions 11b of FIG. 3, the sign display portion 11b positioned at the uppermost may be shown as a lock shape to indicate a locked state, the sign display portion 11b positioned in the middle may be shown as a filter shape to indicate an operation of a microorganism removal function or a deodorization function, and the sign display portion 11b positioned at the lowermost may be shown as a rotating fan shape to indicate a quick freezing function. The shape of the sign display portion 11b may be various and the number thereof may be various.

The display area 11 may be formed corresponding to an arrangement of second through holes 220 and third through holes 321 which will be described below to transmit light emitted from a light emitting diode (LED) of a display assembly 300. The first through holes 21 are formed with a micro size through laser processing or etching and may have a size that is not easily recognized from the outside in a state in which light passes therethrough.

Even though a shape in which the number display portion 11a and the sign display portion 11b include the plurality of first through holes 21 is shown in FIG. 3, due to the micro size of the first through holes 21, it may be difficult to identify the LED 313 with the naked eye when not turned on in a state of being spaced apart at a certain distance.

That is, in the case of the number display portion 11a, only a part toward which the light is emitted depending on an operation of seven segments passes through the first through holes 21 to display a number on the front panel 20 and a part toward which the light is not emitted is not well identified.

In some examples, in the case of the sign display portion 11b, since the light is emitted when the LED 313 corresponding to the function is turned on, the sign display portion 11b is identifiable from the outside but is not well identified when the LED 313 is turned off.

As described above, the number display portion 11a and the sign display portion 11b which form the display area 11 may be formed of the first through holes 21 having the micro size in which the part toward which the light is not emitted may be difficult to be identified from the outside. Accordingly, other components are not arranged on a front exterior of the refrigerator door 10 and the overall front exterior of the refrigerator door 10 provides simple and luxurious aesthetics by giving a feeling of being formed of a metal plate due to the front panel 20.

In some implementations, the first through hole 21 may be filled with a sealing member 22. The sealing member 22 prevents the first through hole 21 from being blocked with foreign matter. The sealing member 22 is formed of a silicone or epoxy material and may be formed of a material capable of sealing the first through hole 21 while light is passable therethrough. In some implementations, since the inside of the first through hole 21 is filled with the sealing member 22, a machined surface of the first through hole 21 may be prevented from being corroded.

The sealing member 22 may fill the inside of the first through hole 21 through an additional process and may be configured to fill the first through hole 21 or to be attached as a sheet to simultaneously block the plurality of first through holes 21 during a surface coating process of the front panel 20. That is, a fingerprint coating solution and/or a diffusion sheet in the front panel 20 may function as the sealing member 22.

The operation area is a part displayed to allow the user to perform a touch operation and may include the plurality of touch portions 12. Accordingly, the touch portion 12 displays an area sensible by a touch sensor assembly 500 when the user touches an area of the touch portion 12.

The touch portion 12 is not a physical button and designates an area displayed on a front surface of the front panel 20. It is possible to operate a sensor 750 in contact with a rear surface of the front panel 20 by operating the displayed area.

The touch portion 12 may be displayed on the front surface of the front panel 20 through etching, printing, or other surface processing and may be displayed not to be noticeable viewed from the outside to be seen such that overall texture of the front panel 20 forms the exterior. In some implementations, the touch portion 12 may be displayed as a letter or sign shape to allow the user to intuitionally understand and operate a corresponding function of each of the touch portions 12. In some implementations, the touch portion 12 may display an identifiable area when the user performs a touch operation and is configured to effectively identify when a displayed part is pushed.

The door liner 30 is combined with the front panel 20 and forms a surface that faces the inside of the storage space. The door liner 30 is injection-molded using a plastic material and may provide a structure in which a gasket is disposed along a perimeter thereof or on which a basket is mountable. In some implementations, the door liner 30 forms a space between the door liner 30 and the front panel 20 when combined with the front panel 20 and the space may be filled with a foam solution that forms an insulator 24.

A frame 100 may be attached to the rear surface of the front panel 20. The frame 100 is formed to provide an additional space not filled with a foam solution in the refrigerator door 10 and provides a space in which a cover display 200, the display assembly 300, the touch sensor assembly 500, a frame display 400 and the like are accommodated.

The decorative members 40 and 43 form upper and lower exteriors of the refrigerator door 10 and are configured to shield an upper end and a lower end of the refrigerator door 10 which are open and formed by the combination between the front panel 20 and the door liner 30.

Among the decorative members 40 and 43, the decorative member 40 at an upper part of the refrigerator door 10 includes an inlet 41 and an inlet cover 42 that opens and closes the inlet 41. The inlet 41 passes through the decorative member 40 and is connected to the space formed by the frame 100. Accordingly, the user may insert the frame display 400 assembled with the display assembly 300 through the inlet 41. For this, the inlet 41 is formed having a size to allow the frame display 400 to be inserted thereinto and may be positioned perpendicularly above the cover display 200.

In some implementations, a hinge hole in which a hinge that becomes a pivot of the refrigerator door 10 is formed in one side of the decorative member 40. In some implementations, there is provided a structure in which guided wire is movable in and out of inside the frame 100 through the hinge hole and is connectable to a power supply portion of the cabinet.

A door handle 44 may be provided at the decorative member 43 at a lower part of the refrigerator door 10. The door handle 44 is depressed in a pocket shape and configured to operate for pivoting the refrigerator door 10. A lever 45 for opening and closing the refrigerator door 10 is further provided at the decorative member 43 at the lower part of the refrigerator door 10. A latch assembly 31 is driven by operating the lever 45 to select whether the refrigerator door 10 remains in an open mode or a closed mode.

The cover display 200 is attached to the rear surface of the front panel 20. The cover display 200 is for guiding the display assembly 300 on which the LED 313 is mounted, to be mounted and is configured to be attached to the rear surface of the front panel 20 using a double-sided tape or an adhesive member 25 formed by applying primer.

The touch sensor assembly 500 capable of sensing a push operation of the user to the front panel 20 is mounted on one side of the cover display 200. The cover display 200 has a structure capable of being attached to the front panel 20 while combined with the touch sensor assembly 500.

The cover display 200 may be attached at a position where the display area 11 corresponds to the second through holes 220 formed in the cover display 200. In some implementations, the cover display 200 is accommodated in the frame 100 while attached.

In some implementations, the display assembly 300 is inserted in a space in the frame 100 through the inlet 41 while mounted on the frame display 400. When the frame display 400 is completely inserted, the display assembly 300 is positioned inside the cover display 200 and light emitted from the LED 313 may pass through the cover display 200 and the display area 11 and be emitted outward.

Figure 6:
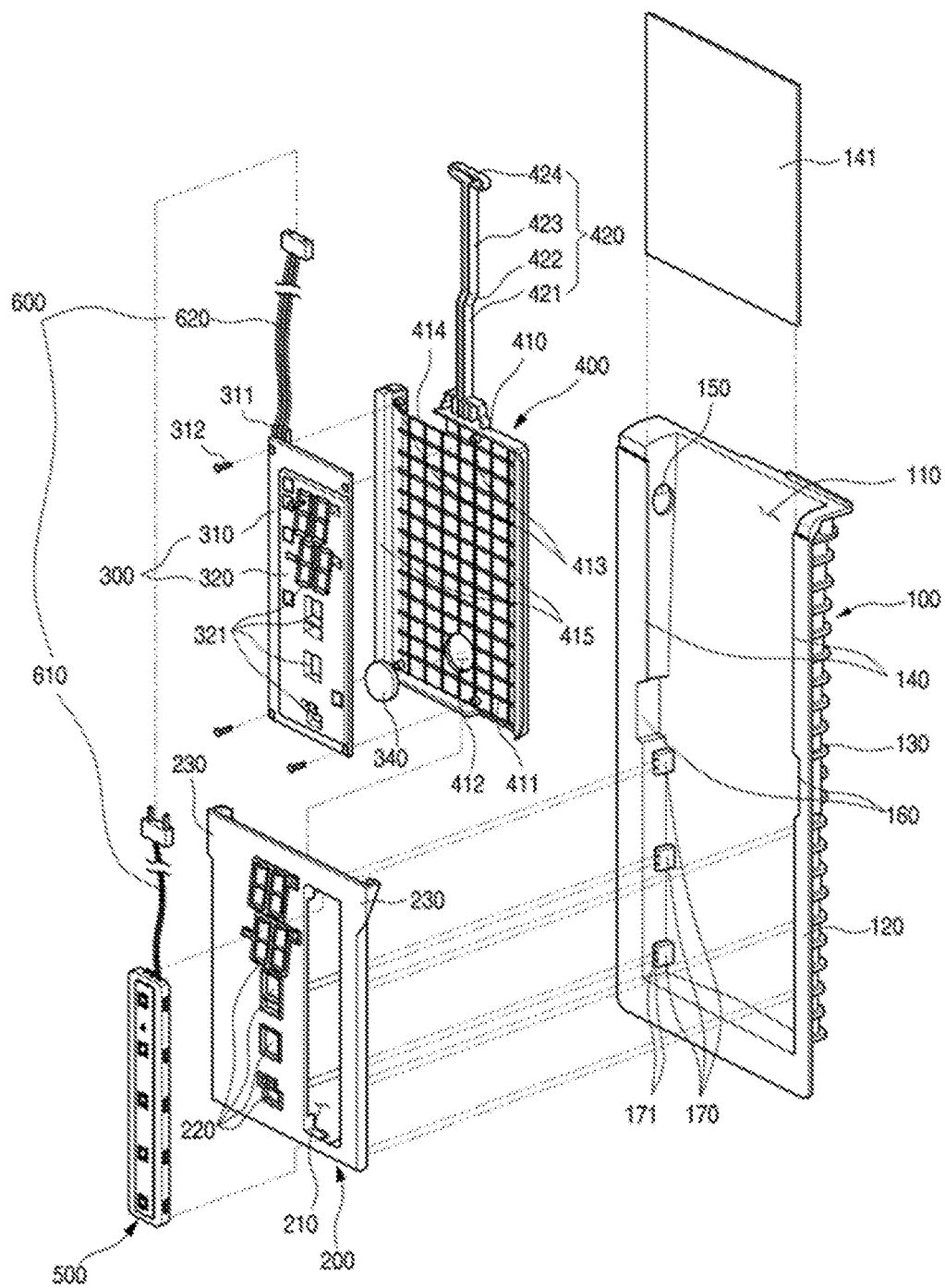
FIG. 6 is an exploded perspective view illustrating an example touch sensor assembly, an example cover display, the example display assembly, an example frame display, and an example frame.
Figure 7:
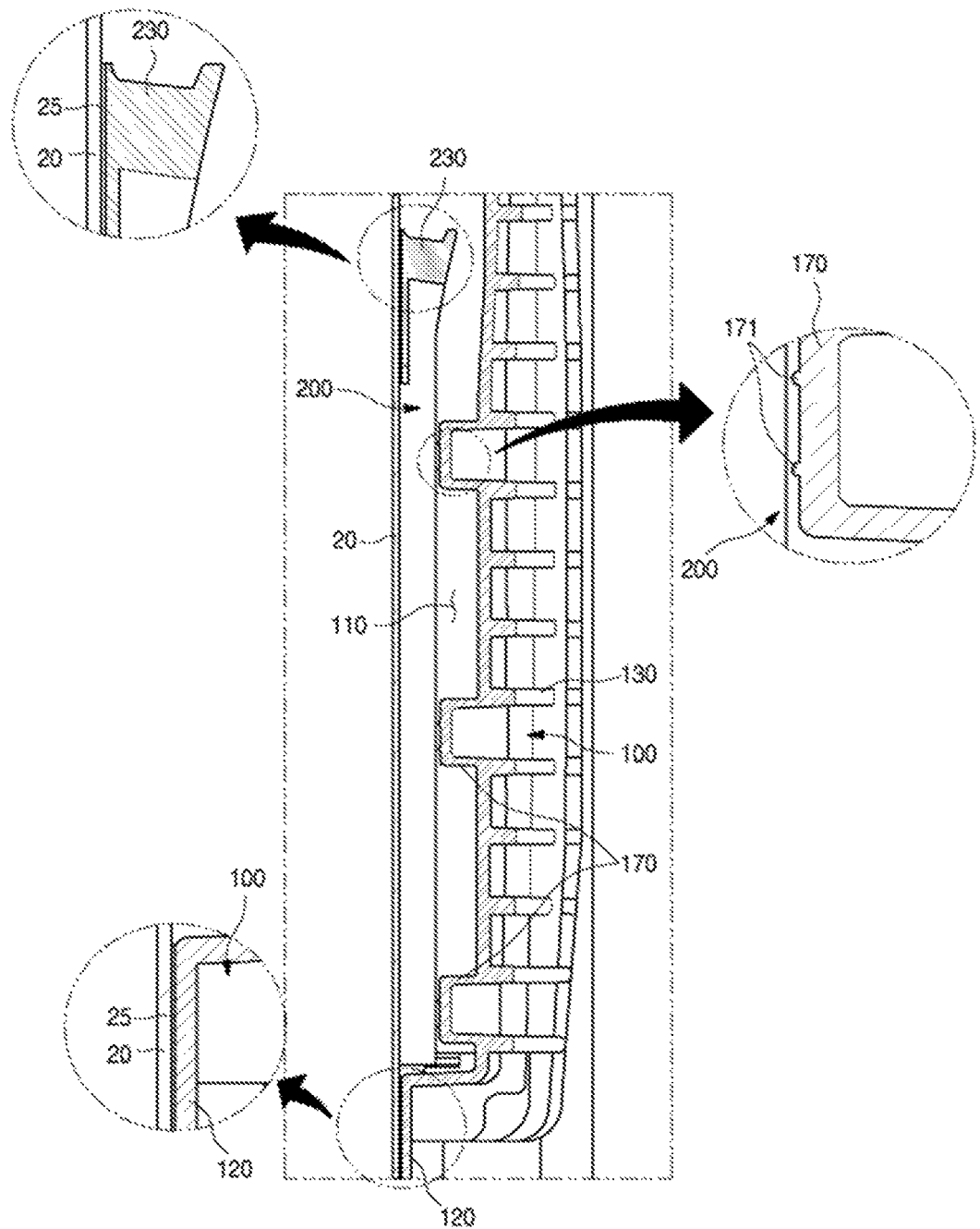
FIG. 7 is a cross-sectional view illustrating an example part taken along line 7-7' of FIG. 4.
Figure 8:
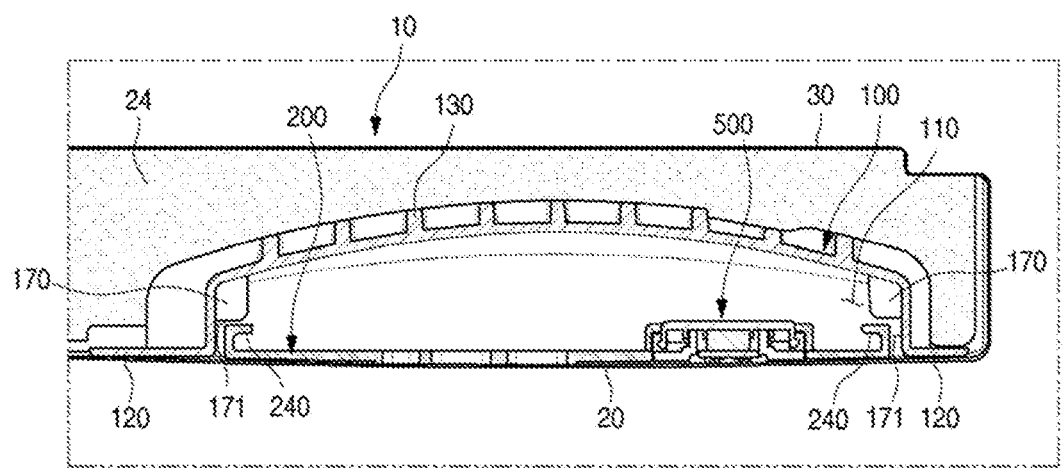
FIG. 8 is a cross-sectional view illustrating an example part taken along line 8-8' of FIG. 4.

FIG. 6 is an exploded perspective view illustrating a combination structure of the touch sensor assembly, the cover display, the display assembly, the frame display, and the frame. FIG. 7 is a cross-sectional view illustrating a part taken along line 7-7' of FIG. 4, and FIG. 8 is a cross-sectional view illustrating a part taken along line 8-8' of FIG. 4.

As shown in the drawings, the frame 100 is formed to have an open front surface and an open top surface and to form a space 110 with an open top surface when attached to the front panel 20. For this, a perimeter of the frame 100 except a top end thereof is bent toward the front panel 20 and an end thereof is bent again toward the outside to from a frame adhesion portion 120. The adhesive member 25 formed of a double-sided tape or an adhesive is provided at the frame adhesion portion 120 in such a way that the frame 100 may be attached to the rear surface of the front panel 20.

The top end of the frame 100 comes into contact with a bottom surface of the decorative member 40 while the frame 100 is attached to the front panel 20. Accordingly, the open top surface of the frame 100 may be interconnected with the inlet 41 and forms an independent space in the refrigerator door 10.

Accordingly, even when a foam solution for forming the insulator 24 is injected into the refrigerator door 10, the foam solution may not flow into the space in the frame 100 and the space may be protected. In some implementations, a plurality of reinforcing ribs 130 are formed on a rear surface of the frame 100 to be longitudinally and laterally intersected with one another. Due to the reinforcing ribs 130, even when the foam solution for forming the insulator 24 is filled at high pressure, the space in the frame 100 may remain without deformation.

In some implementations, plate support portions 140 on which a support plate 141 is mounted are formed at both left and right ends of the top of the frame 100. The support plate 141 is installed in an area of an upper space of the frame 100 corresponding to a top of the cover display 200 while the cover display 200 is mounted, and is configured to support the front panel 20 from the rear. Accordingly, it is possible to prevent not only the heave of a corresponding part of the front panel 20 but also the deformation of the front panel 20 caused by an external shock.

The plate supporters 140 are formed to be stepped and are configured to support both ends of the support plate 141. In some implementations, the support plate 141 may be slidably inserted into a space between the plate supporters 140 and the front panel 20 when the frame 100 is attached to the front panel 20. The support plate 141 may be attached to the rear surface of the front panel 20 when attached to the frame 100 while the both ends thereof are fixed to the plate supporters 140.

A wire port 150 is formed at a top of a side surface of the frame 100. The wire port 150 forms a path for allowing wires for connecting electronic components provided in the frame 100 with a power supply on the cabinet to pass. The wire port 150 may be formed at the top of the side surface close to the hinge of the refrigerator door 10 and be disposed near the hinge hole of the refrigerator door 10. In some implementations, the wire port 150 may be finished when the foam solution is injected into the refrigerator door 10 to prevent the foam solution from penetrating the frame 100.

In some implementations, fastening grooves 160 are formed in both left and right sides of the frame 100. The fastening groove 160 are formed to allow fastening portions 230 that laterally protrude from both left and right ends of the cover display 200 to be inserted therein. That is, the fastening grooves 160 are depressed toward the outside and formed in a shape corresponding to the fastening portions 230 in such a way that the cover display 200 does not move to remain in a precise position.

Cover supporters 170 that support the cover display 200 are formed at parts below the fastening grooves 160 where the cover display 200 is positioned. The cover supporters 170 protrude from the left and right sides of the frame 100 and may push and support the both left and right ends of the cover display 200.

Accordingly, when the frame 100 is attached to the front panel 20 and the foam solution is injected into the refrigerator door 10 while the cover display 200 is attached to the rear surface of the front panel 20, the cover supporters 170 push the cover display 200 forward to allow the cover display 200 to remain in a state of being attached to the front panel 20. For example, even when the adhesive member 25 that attaches the cover display 200 to the front panel 20 is cured and loses a function thereof, the cover supporters 170 pressurize the cover display 200 to allow the front panel 20 and the cover display 200 to remain in a state of being in close contact with each other.

A plurality of such cover supporters 170 are vertically arranged at certain intervals to evenly push the entire cover display 200 to support. In some implementations, a protrusion 171 that protrudes forward is further formed in front of the cover supporter 170 adjacent to the cover display 200. The protrusion 171 is formed in a rib shape or a protrusion shape formed lengthwise in a lateral direction and may come into linear or dot contact with the cover display 200. Accordingly, the cover display 200 does not tilt and each of the cover supporters 170 may transfer even pressures to the cover display 200 even though contact surfaces between the cover display 200 and the cover supporters 170 are uneven.

The cover display 200 is formed of a plastic material in a planar shape and is formed to be accommodative in the frame 100 while attached to the front panel 20. In some implementations, the fastening portions 230 that protrude outward and are inserted into the fastening grooves 160 are formed at tops of the left and right ends of the cover display 200.

In some implementations, an accommodation portion 210 on which the touch sensor assembly 500 is mounted is formed in the cover display 200. In some implementations, a plurality of such second through holes 220 are formed in the cover display 200 at a position corresponding to the display area 11.

The display assembly 300 may include a display printed circuit board (PCB) 310 on which the LED 313 is mounted and a reflector 320 disposed in front of the display PCB 310.

Figure 9:
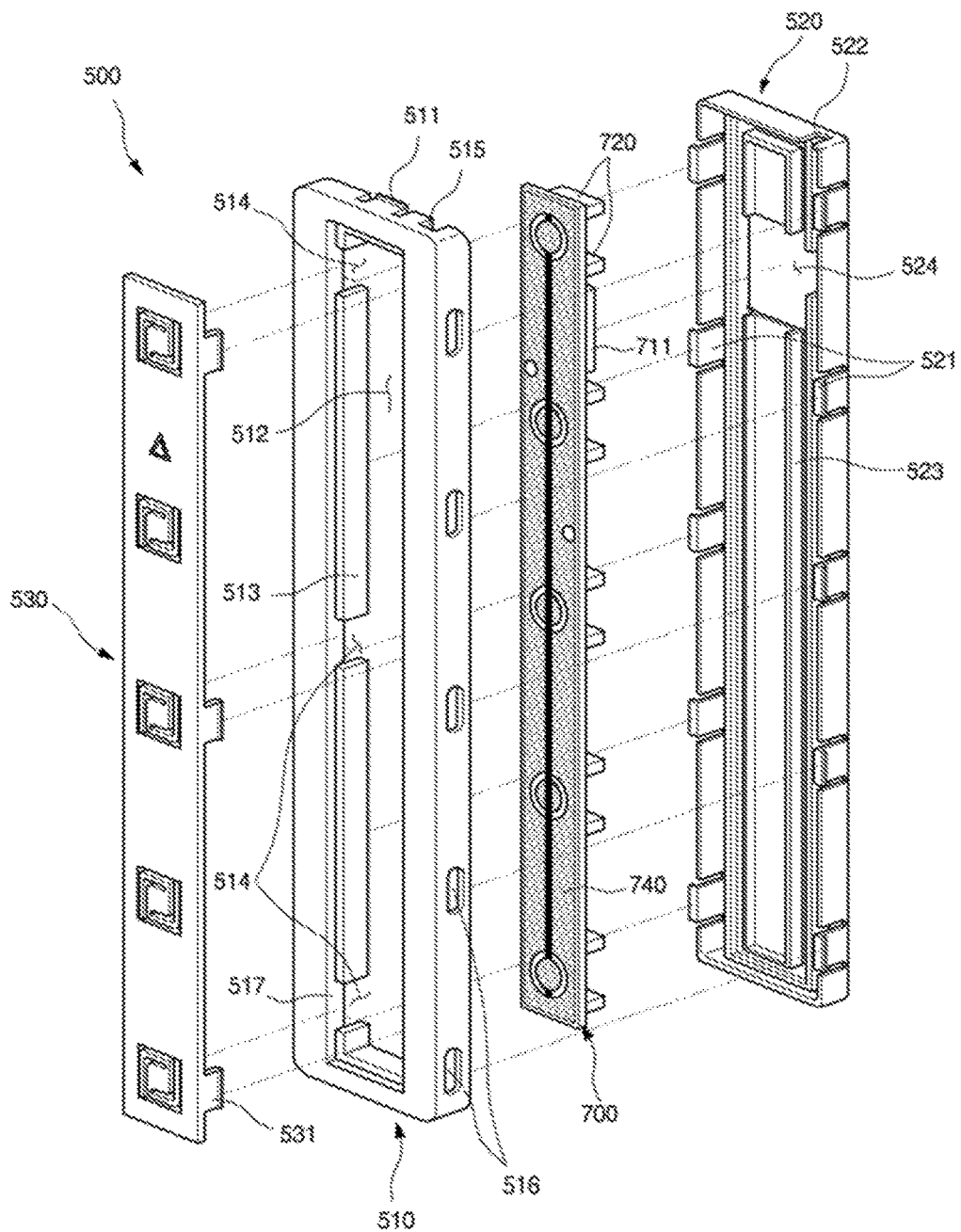
FIG. 9 is a front exploded perspective view illustrating the touch sensor assembly.
Figure 10:
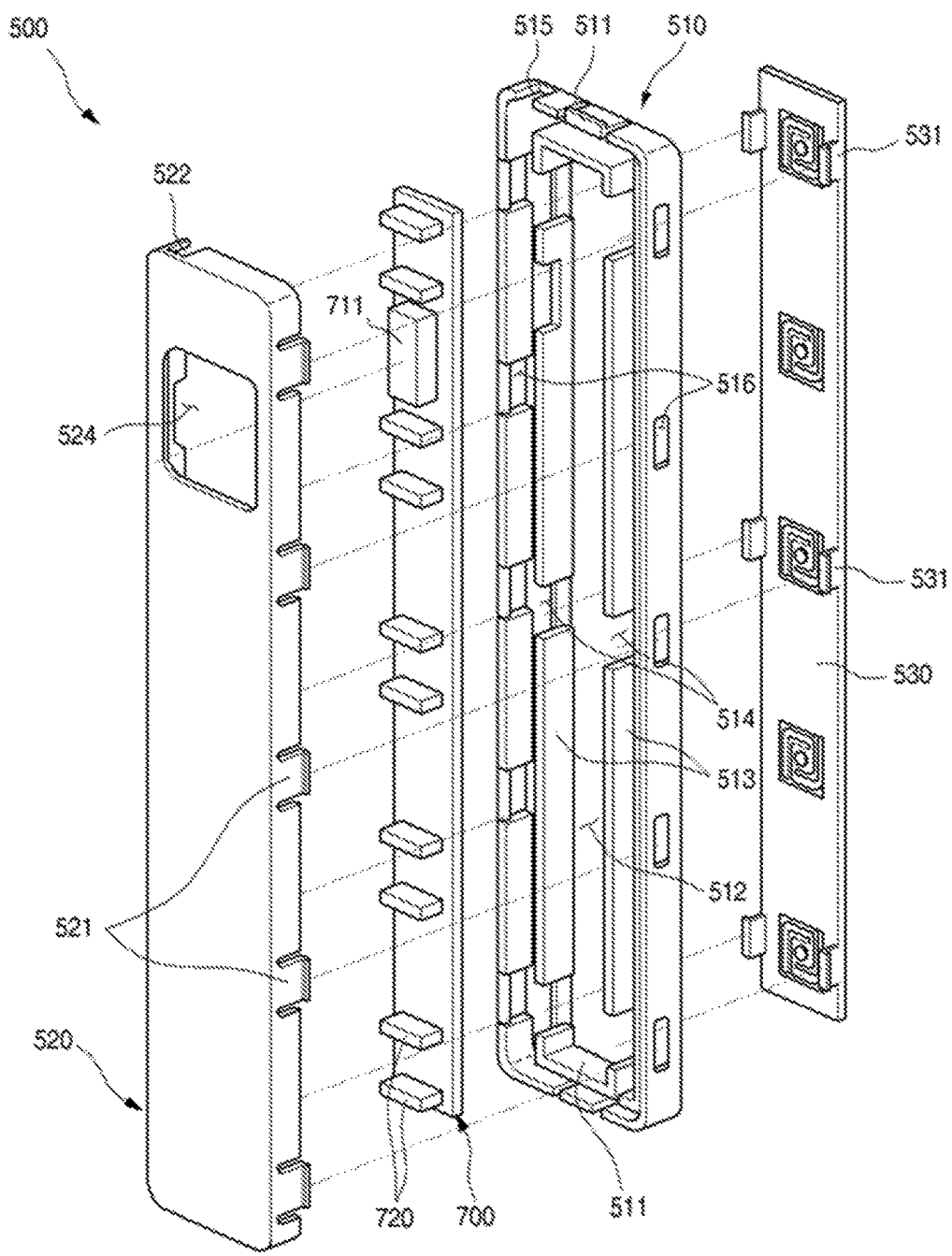
FIG. 10 is a rear exploded perspective view illustrating the touch sensor assembly.

FIG. 9 is a front exploded perspective view illustrating the touch sensor assembly. FIG. 10 is a rear exploded perspective view illustrating the touch sensor assembly.

As shown in the drawings, the touch sensor assembly 500 may include a sensor housing that forms an overall external shape, a sensor PCB 700 accommodated in the sensor housing, elastic members 720 that support the sensor PCB 700, and a touch booster 530 combined with an open front surface of the sensor housing.

The sensor housing may include a housing cover 510 and a housing body 520 which are assembled to form a space in which the sensor PCB 700 is accommodated.

The housing cover 510 forms a front half part of the sensor housing and housing combining portions 511 are formed at a top end and a bottom end thereof to allow the touch sensor assembly 500 to be mounted on the cover display 200. In some implementations, the housing cover 510 may expose the front surface while the touch sensor assembly 500 is mounted on the accommodation portion 210 and may be attached to the rear surface of the front panel 20 using the adhesive member 25.

An opening 512 is formed in a front surface of the housing cover 510, and the touch booster 530 is mounted in the opening 512. The touch booster 530 is for transferring a displacement of the front panel 20 generated when the user pushes the front panel 20 to the sensor 750 which will be described below and a detailed structure will be described below again.

The opening 512 may be formed with a size corresponding to a size of the touch booster 530 and may be shielded by the touch booster 530 when the touch booster 530 is mounted. An extension rib 517 that extends backward is formed on a perimeter of the opening 512 and is formed to come into contact with a perimeter of the sensor PCB 700 to guide the sensor PCB 700 to be moved without tilt when the sensor PCB 700 moves forward and backward.

In some examples, booster supporters 513 formed to protrude inward and extend backward may be further formed on an inside of the opening 512. The booster supporters 513 support a perimeter of the touch booster 530 from the rear when the touch booster 530 is mounted, to prevent the touch booster 530 from being moved backward further than a set position even when a pressure is applied to the touch booster 530.

The booster supporters 513 may be formed along the opening 512, and hook grooves 514 are formed in the booster supporters 513. The hook grooves 514 are formed at positions corresponding to hooks 531 of the touch booster 530 and may be formed by partially cutting the booster supporters 513. The hook grooves 514 may be separately formed in one side of the housing cover 510 adjacent to the opening 512 not at the booster supporters 513.

The hooks 531 and the hook grooves 514 are formed at positions on both left and right sides that face one another and arranged at certain intervals in a vertical direction to prevent the touch booster 530 from being tilted in one direction when the touch booster 530 is operated.

In some examples, the hook grooves 514 are formed lengthwise in a forward and backward direction and formed to allow the hooks 531 to be moved in the forward and backward direction while being positioned inside the hook grooves 514. Accordingly, the touch booster 530 may remain in a state of being combined with the housing cover 510 but may move by a certain distance in the forward and backward direction. In some examples, the touch booster 530 protrudes to allow a front surface thereof to be more forward than the housing cover 510 while being assembled in the housing cover 510. Accordingly, when the touch sensor assembly 500 and the cover display 200 are attached to the front panel 20, the touch booster 530 may remain in a state of being always in contact with the rear surface of the front panel 20.

In some implementations, cover combination portions 516 may be formed on a perimetric surface of the housing cover 510. The cover combination portions 516 are parts to be shape-combined with body combination portions 521 formed at the housing body 520 and may be formed in a groove or hole shape capable of holding and fastening the cover combination portions 516 in a hook shape. Here, it is necessary to form the cover combination portions 516 at positions capable of compressing the elastic members 720 when the cover combination portions 516 and the body combination portions 521 are fastened to each other.

That is, when the housing cover 510 and the housing body 520 are combined with each other, the elastic members 720 are compressed to push the sensor PCB 700 and the touch booster 530 forward. Accordingly, the touch booster 530 may always protrude and remain in a state of being in close contact with the front panel 20 and may effectively sense a push operation of the user to the front panel 20.

In some examples, a wire hole 515 is formed in a top surface of the housing cover 510. The wire hole 515 is opened to allow a first cable connector 610 connected to a sensor terminal 711 mounted on the sensor PCB 700 to move in and out therethrough. The wire hole 515 may be formed in at least any one of the housing cover 510 and the housing body 520.

The housing body 520 may be combined with the housing cover 510 to form an external shape of a rear half part of the touch sensor assembly 500 and form a space in which the sensor PCB 700 is mountable.

A plurality of such body combination portions 521 are formed on a perimetric surface bent forward along a perimeter of the housing body 520. The body combination portions 521 may be formed by partially cutting the perimetric surface of the housing body 520 and be inserted into the cover combination portions 516 to allow the housing cover 510 and the housing body 520 to remain in a state of being combined with each other.

All the cover combination portions 516 and the body combination portions 521 are arranged at equidistant intervals and arranged at the same positions of the left and right sides to face each other to enable a combination between the housing cover 510 and the housing body 520 at the same time with the same power, thereby preventing the elastic members 720 from being tilted during an assembling process.

In some implementations, a wire hole 522 may be formed on a top surface of the perimeter of the housing body 520. The wire hole 522 may be formed at the same position as that of the wire hole 515 of the housing cover 510 to allow the first cable connector 610 to move in and out therethrough.

A mounting guide 523 may be formed at a bottom surface of the housing body 520. The mounting guide 523 may guide a plurality of such elastic members 720 and may be formed to accommodate the elastic members 720 attached to the sensor PCB 700.

The mounting guide 523 may be formed in a shape corresponding to that of the sensor PCB 700 and may form a space corresponding to a lateral width of the elastic members 720. Accordingly, the elastic members 720 may be positioned in an internal area of the mounting guide 523 and both left and right side surfaces of the mounting guide 523 support both left and right ends of the elastic members 720. Accordingly, while the elastic members 720 are compressed, it may be possible to stably support the elastic members 720 without distortion or tilt in one direction.

In some examples, a terminal hole 524 may be formed to be open in the bottom surface of the housing body 520 corresponding to the sensor terminal 711 provided at the sensor PCB 700. The terminal hole 524 may be formed in a shape corresponding to the sensor terminal 711 and may be formed to expose the sensor terminal 711 through the terminal hole 524. Accordingly, even when the sensor PCB 700 moves forward and backward, the sensor terminal 711 may not interfere with a bottom of the housing body 520.

In some implementations, since the first cable connector 610 may be combined with a side surface of the sensor terminal 711, it may be possible to check a combination state between the first cable connector 610 and the sensor terminal 711 through the terminal hole 524.

In some implementations, the sensor PCB 700 may be supported by the elastic members 720 in the sensor housing while a spacer 730, the sensor 750, and a conductive foil 740 are arranged thereon. In some implementations, the touch booster 530 may be mounted in the opening 512 to be movable forward and backward and may contact the front panel 20 and the conductive foil 740 to immediately transfer a displacement generated when a push operation is performed to the sensor 750.

Figure 11:
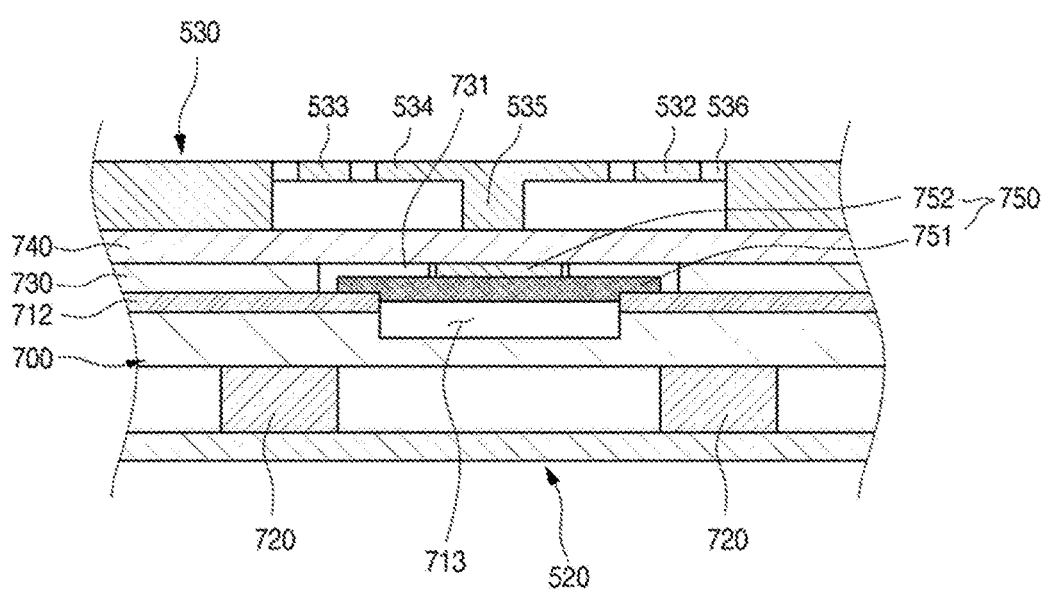
FIG. 11 is a longitudinal cross-sectional view of the touch sensor assembly.
Figure 12A:
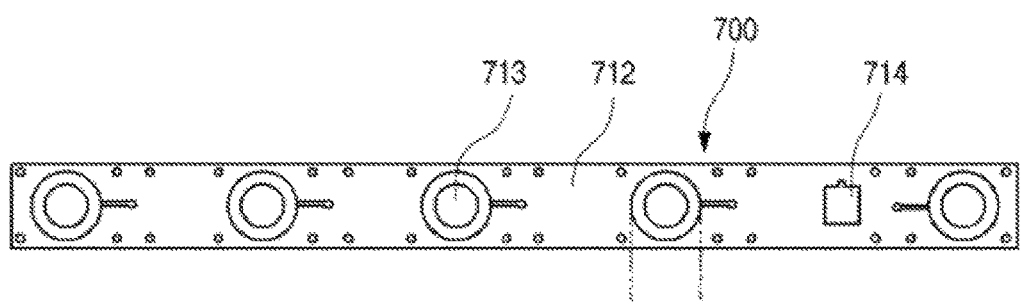
FIGS. 12A and 12B are, respectively, a plan view and a rear view of an example sensor printed circuit board (PCB) of the touch sensor assembly.
Figure 12B:
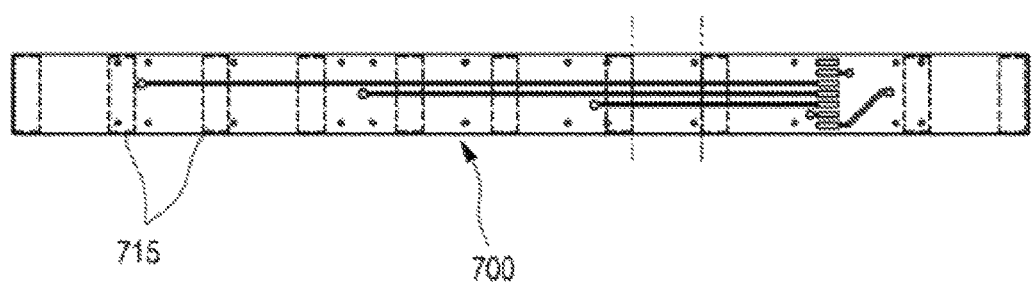
Figure 13:
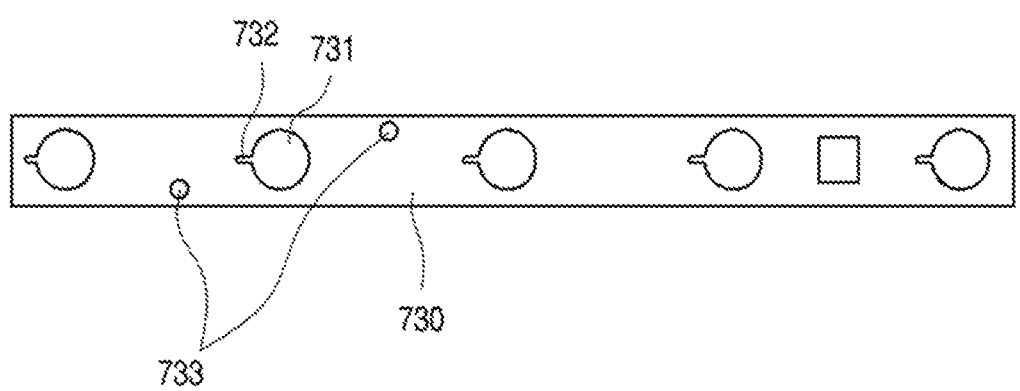
FIG. 13 is a plan view of an example spacer of the touch sensor assembly.
Figure 14:
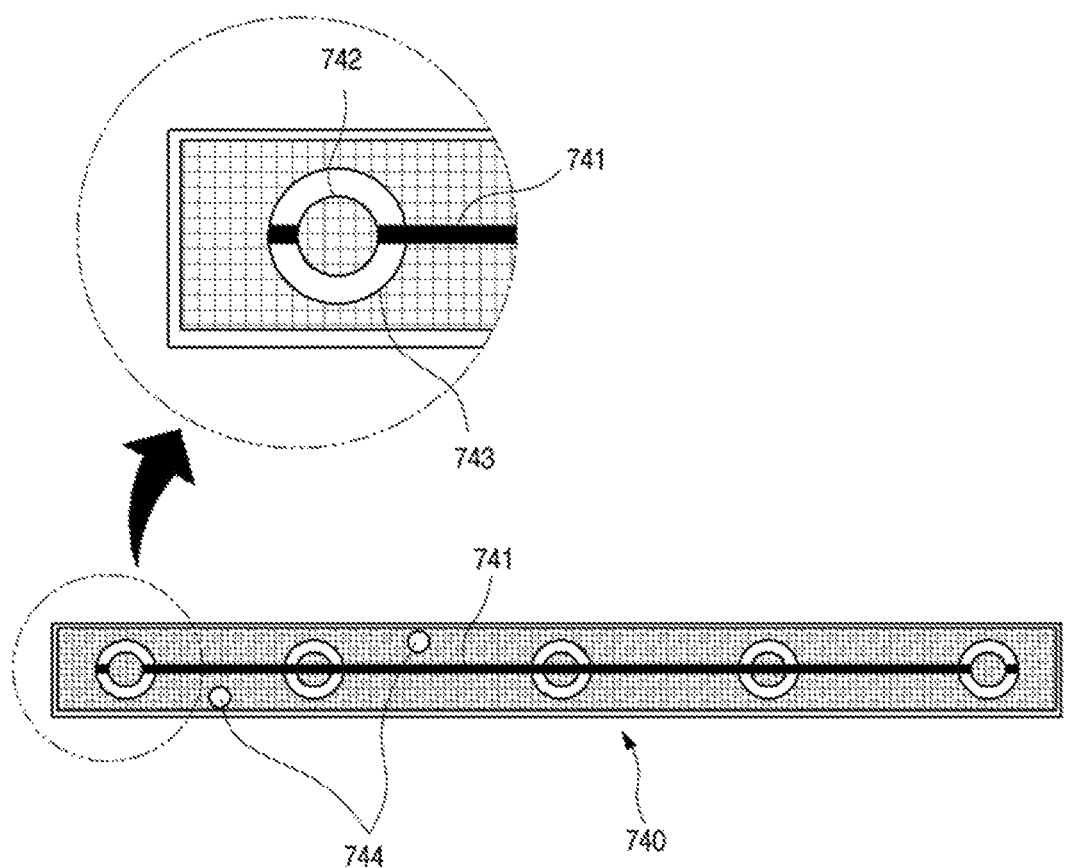
FIG. 14 is a plan view of an example conductive foil of the touch sensor.

FIG. 11 is a longitudinal cross-sectional view of the touch sensor assembly. In some implementations, FIGS. 12A and 12B are a plan view and a rear view of the sensor PCB that is a significant component of the touch sensor assembly. FIG. 13 is a plan view of the spacer that is a significant component of the touch sensor assembly. In some implementations, FIG. 14 is a plan view of the conductive foil that is a significant component of the touch sensor assembly.

In some implementations, the sensor PCB 700 may be formed of a plastic material, and a copper film 712 that forms a circuit may be printed on a surface thereof. In some implementations, the sensor 750 that senses a push displacement of the front panel 20 caused by a touch of the user may be provided on a front surface of the sensor PCB 700.

The sensor 750 may be formed of a piezoelectric sensor. For example, the sensor 750 may be formed by attaching a ceramic element 752 to a top surface of a metal plate 751. The metal plate 751 may be elastically deformable according to a pressure of a touch operation of the user to the front panel 20, and the ceramic element 752 generates a change in electric quantity caused by the pressure. In some implementations, the sensor 750 has been described as being formed in a circular shape, for instance. However, the sensor 750 is not limited to the circular shape and may be formed in various shapes.

In some implementations, a plurality of such sensors 750 may be formed along the sensor PCB 700 and a sensor supporter 713 is formed on the front surface of the sensor PCB 700 on which the sensor 750 is mounted.

The sensor supporter 713 may be defined by a groove with a diameter smaller than a size of the sensor 750 and is formed to support a perimeter of the sensor 750, and more precisely, a perimeter of the metal plate 751 from below. That is, the sensor supporter 713 has a feature of supporting the perimeter of the metal plate 751. Accordingly, the sensor supporter 713 may be formed in a shape of a protrusion that supports the perimeter of the metal plate 751 not in a groove shape. In some implementations, a size of the sensor supporter 713 may be smaller than a diameter of the metal plate 751 and larger than a diameter of the ceramic element 752. Accordingly, the metal plate 751 may be deformed by a pressure applied from the front, and the ceramic element 752 may effectively sense a change in pressure.

In some implementations, a common contact point 714 connected by positive poles of the plurality of sensors 750 and the circuit may be formed in one side of the sensor PCB 700. The common contact point 714 is configured to connect bottom surfaces of the plurality of sensors 750 and to come into contact with a conductive line 741 of the conductive foil 740 and be connected to negative poles of the plurality of sensors 750 when the conductive foil 740 is adhered, to allow the sensors 750 to be conductive.

Mounting display portions 715 that display precise mounting positions of the elastic members 720 may be formed on a rear surface of the sensor PCB 700. The mounting display portions 715 may be formed by printing or processing and are configured to indicate positions at which the elastic members 720 are mounted.

Figure 17:
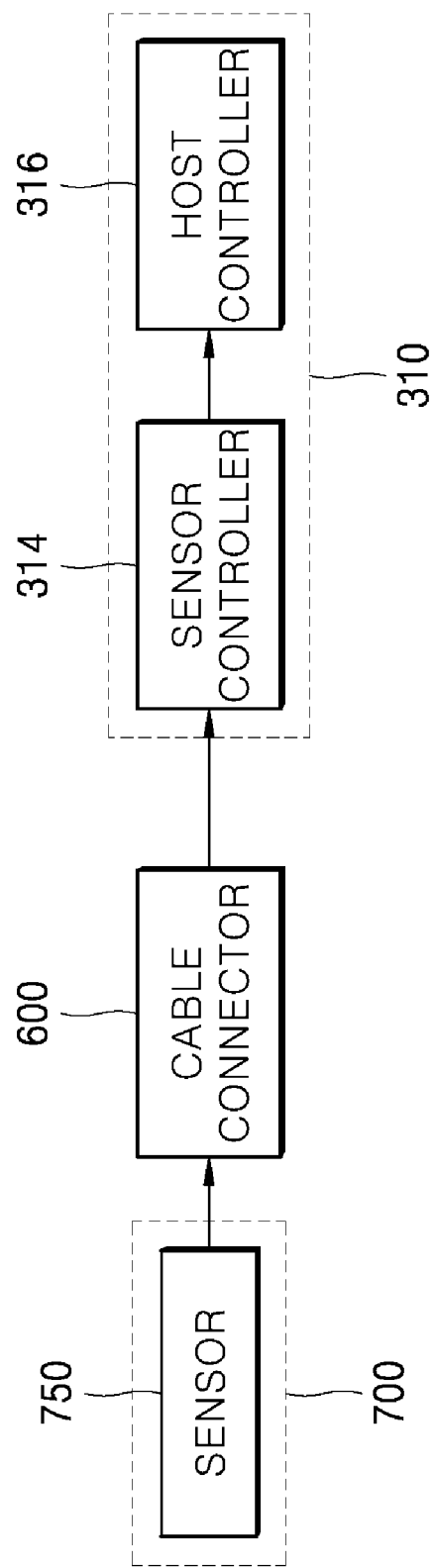
FIG. 17 is a block diagram illustrating an example connection located between the sensor PCB and an example display PCB.

In some implementations, the mounting positions of the elastic members 720, for example, positions of the mounting display portions 715 may be positioned at both left and sides of the position of the sensors 750 (seen from FIG. 17). In some implementations, the mounting positions of the elastic members 720, for example, the positions of the mounting display portions 715 may be positioned more outer than outer ends of the sensor 750. The sensor 750 may be disposed not to be interfered with the elastic members 720 due to the elastic members 720 to prevent detectability of the sensor 750 from being decreased. In some examples, the plurality of elastic members 720 may be arranged at equidistant intervals from the sensor 750 to provide the same pressure to the sensor PCB 700.

In some implementations, the positions of the plurality of sensors 750 may be arranged on the same extension line as those of the body combination portions 521 and the cover combination portions 516. That is, as shown in FIG. 14, the body combination portions 521 and the cover combination portions 516 may be positioned on the same extension lines on both left and right sides of the sensor 750. In some implementations, the body combination portions 521 and the cover combination portions 516 may be arranged to be positioned between a pair of such elastic members 720 adjacent to the sensor 750. Accordingly, on the left and right sides of the sensor 750, the body combination portions 521 and the cover combination portions 516 are positioned and the pair of elastic members 720 are positioned in a direction intersected therewith. All the pluralities of body combination portions 521, cover combination portions 516, elastic members 720 are configured to be arranged as described above. Due to this, a pressure may be evenly applied to the overall sensor PCB 700 positioned in the sensor housing and all the plurality of sensors 750 may sense operation signals of the user in the same condition.

In some implementations, the spacer 730 is attached to the front surface of the sensor PCB 700. The spacer 730 is for adhering the sensor PCB 700 and the conductive foil 740 to each other and may be formed of an adhesive member such as a double-sided tape. The spacer 730 is formed with a size corresponding to sizes of the sensor PCB 700 and the conductive foil 740. In some implementations, the spacer 730 may be formed to have a certain thickness to allow the conductive foil 740 to come into contact with a top surface of the sensor 750 and the common contact point 714 at an adequate height.

In some implementations, a sensor hole 731 may be formed at a position corresponding to the position of the sensor 750 through perforation. The sensor hole 731 is formed to be larger than the size of the sensor 750 to accommodate the sensor 750 therein not to interfere in operation of the sensor 750. In some implementations, the number of such sensor holes 731 corresponds to the number of the sensors 750 and a vent hole 732 cut by a certain length is formed at each of the sensor holes 731.

The vent hole 732 to discharge bubbles generated when the spacer 730 is attached may be formed along a longitudinal direction of the spacer 730, and all the vent holes 732 may extend in one direction. Here, the spacer 730 may be gradually attached in a direction in which the vent holes 732 extend from the sensor holes 731.

In some implementations, guide portions are provided at the spacer 730 and the conductive foil 740 to attach the spacer 730 and the conductive foil 740 at precise positions.

For example, the guide portions are through holes 733 and 744 provided at the spacer 730 and the conductive foil 740. Pluralities of such through holes 733 and 744 may be formed along the spacer 730 and the conductive foil 740 and alternately arranged. In some implementations, operation bars are disposed at the sensor PCB 700 at positions corresponding to the through holes 733 and 744 to pass through the corresponding through holes 733 and 744 to sequentially attach the spacer 730 and the conductive foil 740. The spacer 730 and the conductive foil 740 may be attached at precise positions due to the guide portions and remain at precise intervals from the sensors 750 provided at the sensor PCB 700 to prevent errors generated by the plurality of sensors 750.

The conductive foil 740 may be formed of a resin film material such as PET and may be formed with a size corresponding to those of the sensor PCB 700 and the spacer 730. In some implementations, the conductive line 741 in a mesh shape capable of connecting all the top surfaces of the plurality of sensors 750 and the common contact point 714 is formed at the conductive foil 740. The conductive line 741 is printed on a bottom surface of the conductive foil 740 using a silver material, and the surface on which the conductive line 741 is printed comes into contact with the spacer 730 and simultaneously comes into contact with the sensors 750 and the common contact point 714.

In some implementations, an inner guide line 742 and an outer guide line 743 are printed on the conductive foil 740 to attach the sensor 750 at the precise position. The inner guide line 742 is formed corresponding to a size of the ceramic element 752, and the outer guide line 743 is formed corresponding to a size of the metal plate 751. Accordingly, when the sensor 750 is mounted at the precise position, the ceramic element 752 is positioned on the inner guide line 742 and the metal plate 751 is positioned on the outer guide line 743. In some implementations, the conductive line 741 having a lattice or mesh shape connects the common contact point 714 to the top surface of the sensor 750, for example, the negative pole to allow the sensor 750 to be conductive.

Figure 15:
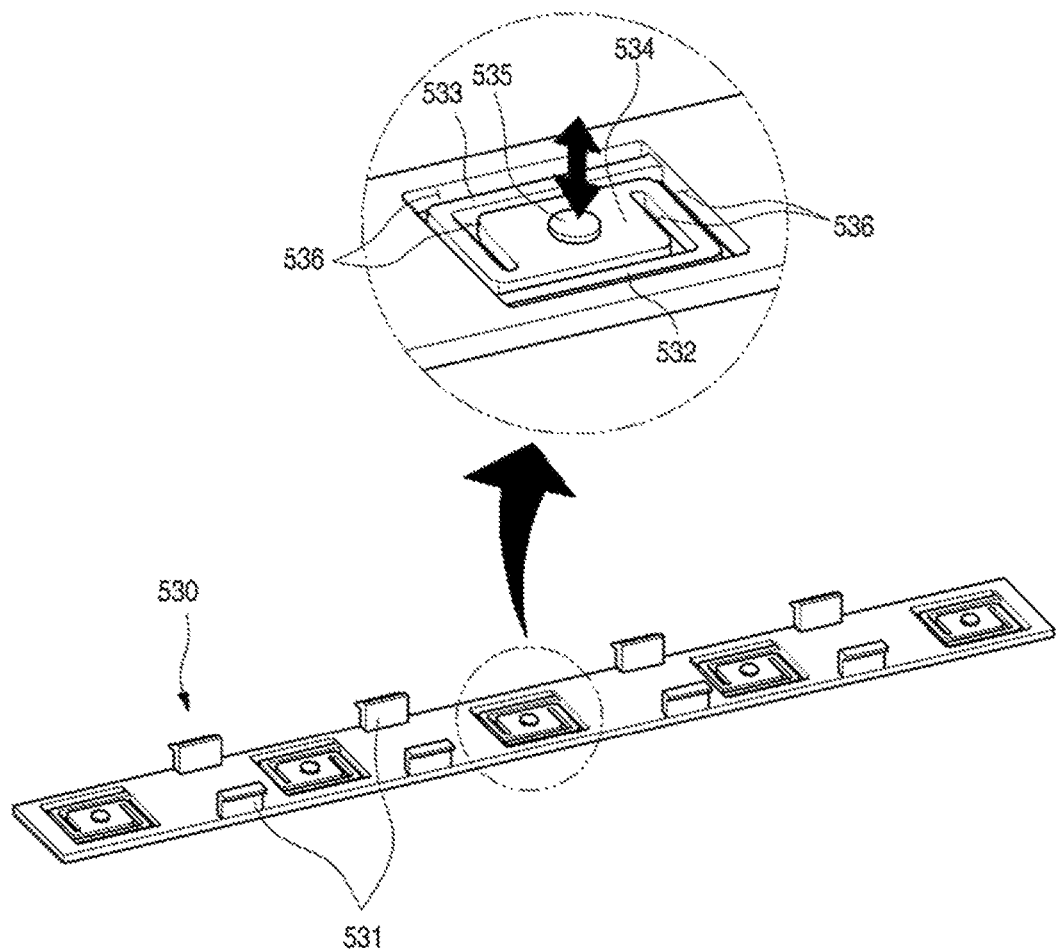
FIG. 15 is a rear perspective view of an example touch booster of the touch sensor assembly.

FIG. 15 is a rear perspective view of the touch booster that is a significant component of the touch sensor assembly.

As shown in the drawing, the touch booster 530 is formed with a size corresponding to that of the opening 512 of the housing cover 510 to shield the opening 512. In some implementations, the hooks 531 are formed on both left and right ends of the housing cover 510. The hooks 531 are combined with the hook grooves 514 formed at the housing cover 510, and a plurality of such hooks 531 are formed at certain intervals. In some implementations, the hook 531 is formed to be movable forward and backward in the hook groove 514.

In some implementations, a plurality of elastic deformation portions corresponding to the number of the sensors 750 are formed at the touch booster 530. The elastic deformation portions are formed at positions corresponding to positions of the touch portions 12 of the front panel 20 and the sensors 750 and have an elastically deformable structure to be movable forward and backward. Accordingly, when the user pushes the touch portion 12, a part corresponding to an area of the touch portion 12 moves backward according to a deformation of the front panel 20 and may pressurize the sensor 750. In some implementations, the elastic deformation portion is configured to return to an original position when the user removes a hand from the touch portion 12.

For example, the elastic deformation portion may include a first extension portion 532 that extends from one side of an open area of the touch booster 530, a second extension portion 533 that extends from a position opposite the first extension portion 532, and a common portion 534 disposed in a center to connect the first extension portion 532 and the second extension portion 533.

The first extension portion 532 and the second extension portion 533 are formed to have relatively small widths to allow the common portion 534 to be movable and extend to have adequate lengths while bent at least one time to be easily elastically deformable. The first extension portion 532 and the second extension portion 533 are bent along a perimeter of the common portion 534 and may be formed to be symmetrical based on the common portion 534. In some implementations, other areas except the first extension portion 532, the second extension portion 533, and the common portion 534 are spirally cut toward a center of the common portion 534 to form a cut portion 536 and may be cut to be bent along perimeters of the first extension portion 532, the second extension portion 533, and the common portion 534.

In some implementations, a protrusion 535 that protrudes downward is formed at a bottom surface of the common portion 534. The protrusion 535 is positioned in the center of the common portion 534 at a position corresponding to a center of the sensor 750. Accordingly, when the common portion 534 moves backward, the center of the sensor 750 may be pressurized.

Figure 16:
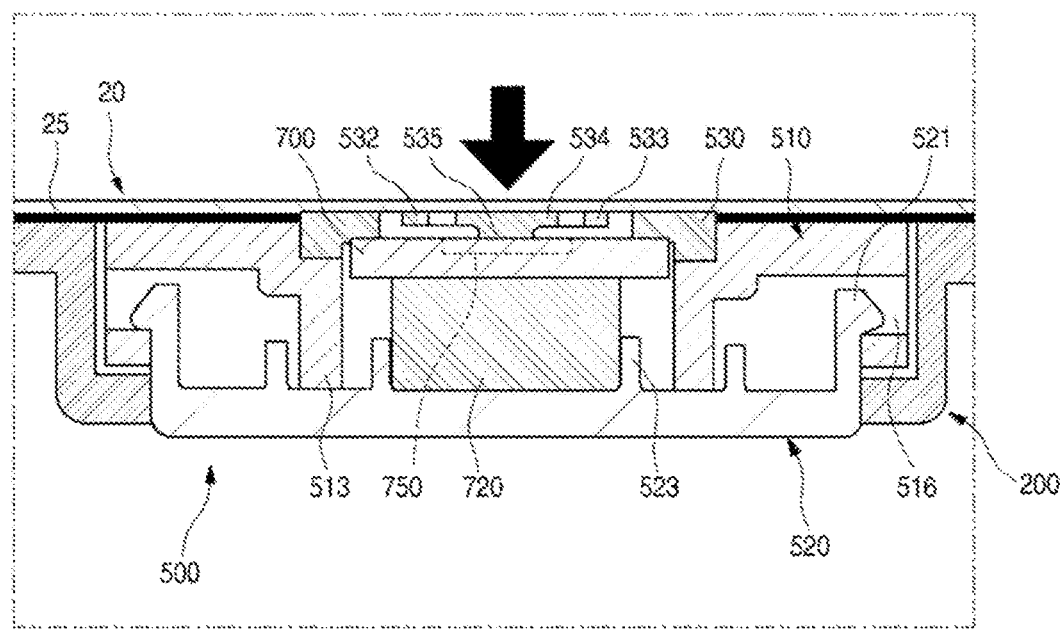
FIG. 16 is a lateral cross-sectional view illustrating the touch sensor assembly mounted on the refrigerator door.

FIG. 16 is a lateral cross-sectional view illustrating the touch sensor assembly mounted on the refrigerator door.

As shown in the drawing, the touch sensor assembly 500 is attached to the front panel 20 while being mounted on the cover display 200. Here, the adhesive member 25 is attached to the front surface of the cover display 200 and the front surface of the housing cover 510 to adhere the cover display 200 and the touch sensor assembly 500 to the rear surface of the front panel 20.

Here, the adhesive member 25 is not provided at the touch booster 530 and the touch booster 530 comes into contact with the rear surface of the front panel 20. For this, when the touch sensor assembly 500 is assembled, the elastic members 720 are compressed and push the sensor PCB 700 forward. Accordingly, the sensor PCB 700 comes into contact with the touch booster 530. The touch booster 530 is movable forward and backward while being combined with the housing cover 510 and is configured to further protrude forward than the front surface of the housing cover 510 due to the pressure applied by the elastic members 720.

In some examples, even when the cover display 200 and the housing cover 510 are adhered to the front panel 20 due to the adhesive member 25, the front surface of the touch booster 530 remains in a state of being in complete contact with the rear surface of the front panel 20.

In the above-described state, when the user touches the touch portion 12 of the front panel 20, a displacement occurs in an operated area of the front panel 20. The displacement of the front panel 20 is transferred to and pressurizes the sensor 750 through the touch booster 530 in the state of being in complete contact, and the operation of the user is sensed therethrough.

In some implementations, when the hand is removed from the touch portion 12, due to a restoration force of the elastic member 720, a restoration force of the touch booster 530, and a restoration force of the metal plate 751 of the sensor 750, the sensor PCB 700 and the touch booster 530 move forward again and return to original states before operation.

The refrigerator 1 may be configured such that a deformation occurs at the front panel 20 when the touch portion 12 is operated by the user, the sensor 750 generates an electric signal, for example, an input signal due to a pressure caused by the deformation of the front panel 20 and transfers the electric signal to a sensor controller 314 to sense the touch operation of the user. For example, when the area of the touch portion 12 displayed on the front panel 20 is pushed, the operation of the user may be most precisely sensed.

When the user pushes other area than the touch portion 12, the sensor 750 may not precisely sense the operation and may not sense a touch operation.

In some implementations, when an area between the plurality of touch portions 12 is pushed, due to a structural feature of the front panel 20 formed in one panel shape, two sensors 750 may sense the touch operation at the same time. In this state, it may be difficult to adequately instruct an operation of the refrigerator 1.

In some implementations, due to the structure and application features of the refrigerator door 10, a shock may occur when the refrigerator door 10 is closed. Due to the shock, the front panel 20 may be temporarily deformed or the plurality of sensors 750 may be instantaneously pressurized. Herein, due to an unexpected sensing of the sensor 750, malfunction of the sensor 750 may occur.

To prevent the above-described malfunction of the sensor 750, the touch sensor assembly 500 may have a structure in which the sensor PCB 700 is supported by the elastic members 720 and the sensor 750 is mounted on the sensor PCB 700.

In some implementations, the elastic members 720 support the sensor PCB 700 at positions corresponding to the outer ends of the sensor 750 on both sides of the sensor 750 due to a positional feature. Accordingly, when the area between the plurality of touch portions 12 is pushed, a force applied by the user is not transferred to the sensor 750 and is discharged through the elastic members 720. That is, since the force applied to the front panel 20 is applied to the elastic members 720, a force transferred to the sensor 750 is reduced and the sensor 750 adjacent thereto is prevented from sensing. In some implementations, since the elastic member 720 absorbs and buffers the shock generated when the refrigerator door 10 is closed, mal-operation and malfunction may be prevented by minimizing a pressure transferred to the sensor 750.

FIG. 17 is a block diagram illustrating an example connection between the sensor PCB and the display PCB.

When the user pushes one of the touch portions 12 in an operated area, a pressure generated when the front panel 20 is deformed may be transferred to the sensor 750. The sensor 750 generates an electric signal according to the transferred pressure, for example, an input signal. The input signal generated as described above is transferred to the sensor controller 314 through a cable connector 600.

The sensor controller 314 may sense a touch operation of the user by processing the input signal transferred through the cable connector 600. For example, the sensor controller 314 may sense the touch operation of the user as a push operation when a voltage value of the input signal transferred by the touch operation of the user is a predetermined first operation voltage value or less. In some implementations, the sensor controller 314 may sense the touch operation of the user as a release operation when a voltage value of the input signal transferred by the touch operation of the user is a predetermined second operation voltage value or more. In some examples, the first and second operation voltage values may refer to first and second threshold voltages, respectively.

As described above, the touch operations of the user may be divided into an operation (the push operation) in which the user pushes the touch portion 12 and an operation (the release operation) in which the user removes a finger from the touch portion 12. A conventional sensor controller cannot sense the above-described push operation and release operation separately and senses only one operation (for example, the release operation). However, the sensor controller 314 may individually sense the push operation and the release operation.

The sensor controller 314 transfers each of operation results of the touch operations of the user determined based on the input signal, to a host controller 316. That is, when a touch operation is generated by the user, the sensor controller 314 informs the host controller 316 that the generated touch operation is a push operation or a release operation.

The host controller 316 performs control corresponding to each of touch operations of the user, namely, a push operation and a release operation. For example, when a push operation is generated by the user, the host controller 316 may control information corresponding thereto to be displayed through a display area. As another example, the host controller 316 may perform control for increasing or decreasing a set temperature of the refrigerator 1 when a release operation is generated by the user. For reference, controlling of the host controller 316 corresponding to a push operation or a release operation of the user is not limited thereto and may vary according to implementations.

As described above, only one of a push operation and a release operation is sensed by a conventional sensor controller. Accordingly, a conventional host controller also controls a refrigerator based on only one of the two operations. When the refrigerator is controlled based on only one operation as described above, it is impossible to variously control and a response speed of a touch operation of a user is decreased. However, a push operation and a release operation may be individually sensed by the sensor controller 314 and the host controller 316 may also control the refrigerator 1 corresponding to each of the operations. Accordingly, it is possible to more variously control the refrigerator than ever and a response speed of a touch operation is increased.

Figure 18:
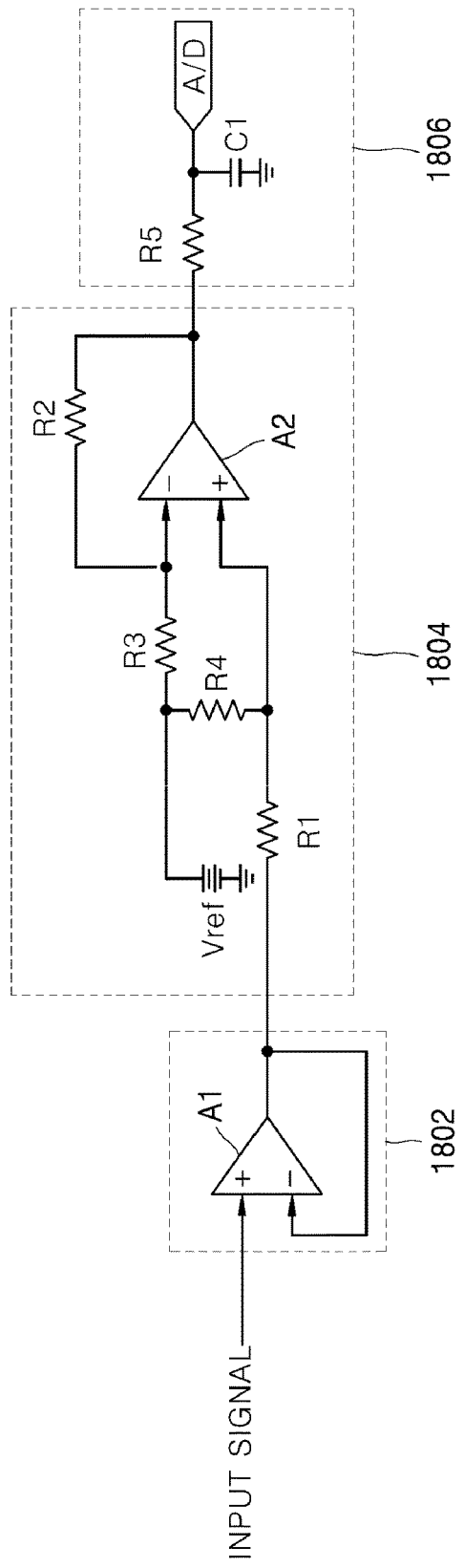
FIG. 18 is a circuit configuration diagram of an example sensor controller.

FIG. 18 is a circuit configuration diagram of an example sensor controller.

Referring to FIG. 18, the sensor controller includes a voltage follower circuit 1802, an amplification circuit 1804, a filtering circuit 1806, and an analog-digital converter A/D. In some examples, the sensor controller may not include all the circuits shown in FIG. 18, and one or more circuits may be omitted depending on implementations.

The voltage follower circuit 1802 amplifies power of an input signal input from the sensor 750. When the input signal passes through an amplifier A1, a voltage level of the input signal remains the same but current intensity thereof is increased. Accordingly, the power of the input signal is amplified. Accordingly, when the voltage follower circuit 1802 is used, the input signal may be stably transferred to the amplification circuit 1804.

The amplification circuit 1804 amplifies the input signal that passes through the voltage follower circuit 1802 according to a predetermined ratio. In some implementations, the amplification circuit 1804 may be formed as a differential amplifier but other types of amplifier may be used depending on implementations.

Referring to FIG. 18, the amplification circuit 1804 includes a differential amplifier A2 and a plurality of resistors R1 to R4 connected between an input terminal and an output terminal of the differential amplifier A2. In more detail, the amplification circuit 1804 includes a first resistor R1 connected to a positive terminal + of the differential amplifier A2 and a second resistor R2 connected between the output terminal of the differential amplifier A2 and a negative terminal −. In some implementations, the amplification circuit 1804 includes a third resistor R3 connected between the negative terminal − and a reference power supply Vref.

In some implementations, the amplification circuit 1804 includes a fourth resistor R4. As shown in FIG. 18, one end of the fourth resistor R4 is connected between the first resistor R1 and the positive terminal + and the other end of the fourth resistor R4 is connected between the reference power supply Vref and the third resistor R3.

The above-described amplification circuit 1804 amplifies a voltage value of an input signal input through the voltage follower circuit 1802 according to a preset ratio. In some implementations, when each of resistor values is set to satisfy an equation $R1/R4=R3/R2$, a voltage value Vo of an amplified input signal output through the output terminal − may be defined by an equation $Vo=(R2/R3)\times(Vi-Vref)$. Here, Vi refers to a voltage value of an input signal input to the positive terminal + of the differential amplifier A2.

In some implementations, an amplification circuit may output a predetermined reference operation voltage value when an input signal is not transmitted from the sensor 750. In some implementations, the reference operation voltage value may be set to be greater than 0. In some implementations, the reference operation voltage value may be set as an average value between a first operation voltage value and a second operation voltage value.

For example, the amplification circuit 1804 of FIG. 18 may amplify a difference value between a voltage value of an input signal input to the positive terminal + and a reference voltage value Vref according to a predetermined ratio (R2/R3). The amplification ratio (R2/R3) of the amplification circuit 1804 may be arbitrarily set by the user through controlling each of resistance values of the second resistor R2 and the third resistor R3.

Figure 19:
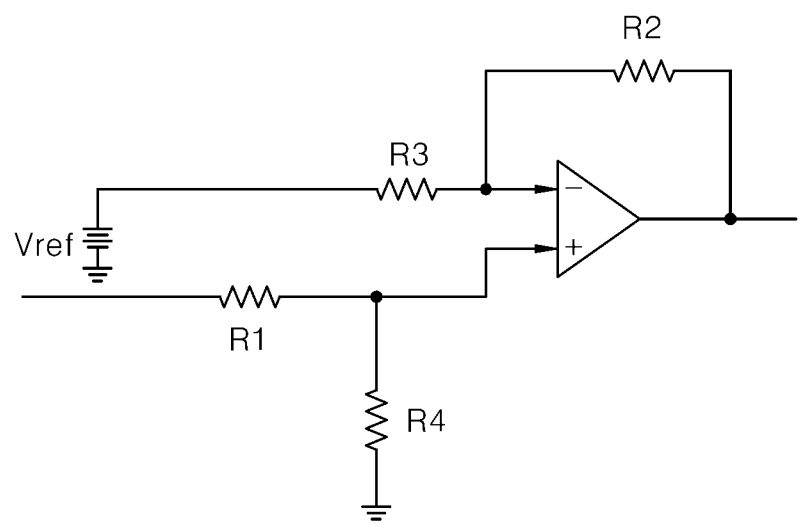
FIG. 19 is a circuit diagram of a conventional amplification circuit.

FIG. 19 is a circuit diagram of a conventional amplification circuit.

When comparing FIG. 18 and FIG. 19, the fourth resistor R4 of the amplification circuit 1804 is disposed differently from that of the amplification circuit of FIG. 19. That is, another end of a fourth resistor R4 is connected to a ground terminal in the conventional amplification circuit of FIG. 19 but the other end of the fourth resistor R4 of the amplification circuit 1804 of FIG. 18 is connected between the reference power supply Vref and the third resistor R3. As shown in FIG. 18, since the other end of the fourth resistor R4 is connected between the reference power supply Vref and the third resistor R3, the amplification circuit 1804 remains in a floating state even when an input signal is not input. Here, the floating state means a state in which a signal having a random voltage level is output through the output terminal − of the differential amplifier A2 while an input signal is not input through the positive terminal + of the amplification circuit 1804.

Referring to FIG. 18 again, the filtering circuit 1806 removes a noise signal included in an amplified input signal output through the amplification circuit 1804. The filtering circuit 1806 of FIG. 18 is a resistor-capacitor (RC) filter including a resistor R5 and a capacitor C1 but different types of filtering circuit may be used depending on implementations. For examples, the filter circuit 1806 may be a low pass filter that attenuate the noise signal from the amplified input signal.

The analog-digital converter A/D converts a voltage value of an analog type input signal that passes through the filtering circuit 1806 into a digital value. The sensor controller 314 determines whether a touch operation of the user is a push operation or a release operation by comparing a digital value output by the analog-digital converter A/D with a predetermined first operation voltage value and a predetermined second operation voltage value.

Figure 20:
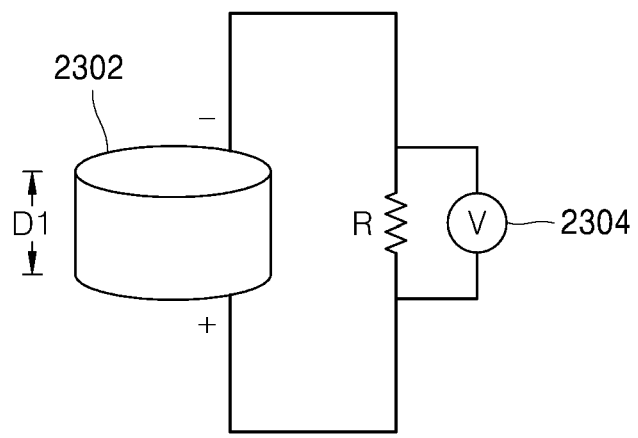
FIG. 20 is a view illustrating a state of an example piezoelectric sensor when a force is not applied.

FIG. 20 is a view illustrating a state of an example piezoelectric sensor when a force is not applied. FIG. 21 is a graph illustrating a level of the force applied to the piezoelectric sensor shown in FIG. 20 and a level of voltage generated by the piezoelectric sensor.

The piezoelectric sensor is a sensor for sensing a pressure applied from the outside using a piezoelectric effect shown in a particular mineral. When a particular mineral that shows the piezoelectric effect is compressed or elongated by applying a force to the particular mineral along a particular axis, a polarizing phenomenon occurs inside the mineral. The polarizing phenomenon means a phenomenon in which positive charges and negative charges gather on both ends of a mineral due to movements of charges inside the mineral. Due to the polarizing phenomenon, the mineral forms an electric field. As described above, a phenomenon in which an electric field is formed at a particular mineral as a force is applied in a compression or elongation direction is the piezoelectric effect.

A touch operation of the user may be sensed using a piezoelectric sensor that provides the above-described piezoelectric effect.

FIG. 20 illustrates an example piezoelectric sensor 2302 including an example mineral that provides the above-described piezoelectric effect. As shown in FIG. 20, it is assumed that when any force is not applied to the piezoelectric sensor 2302 from the outside, the piezoelectric sensor 2302 has a length D1.

Figure 21A:
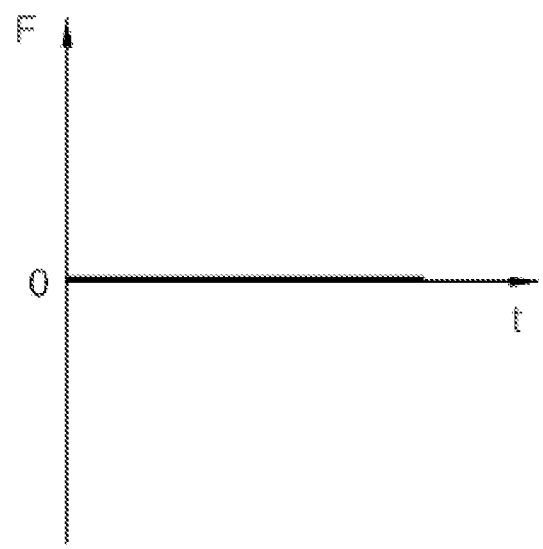
FIGS. 21A and 21B are graphs illustrating a level of the force applied to the piezoelectric sensor shown in FIG. 20 and a level of a voltage generated by the piezoelectric sensor.
Figure 21B:
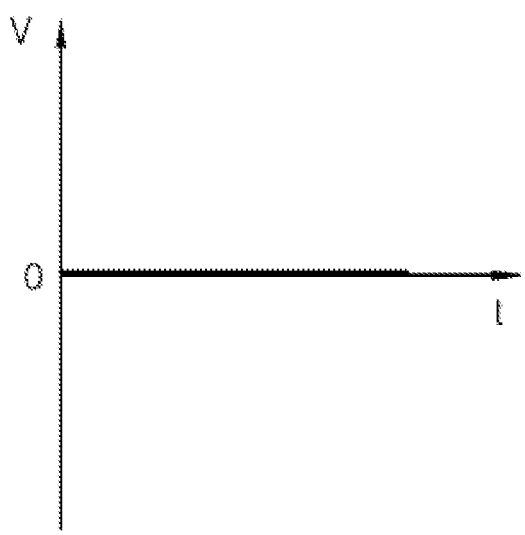

As shown in FIG. 21A, when there is no force applied to the piezoelectric sensor 2302, the piezoelectric sensor 2302 continuously maintains the length D1. That is, since there is no difference in the length of the piezoelectric sensor 2302, a voltage measured by a voltmeter 2304 is continuously indicated as 0 as shown in FIG. 21B.

Figure 22:
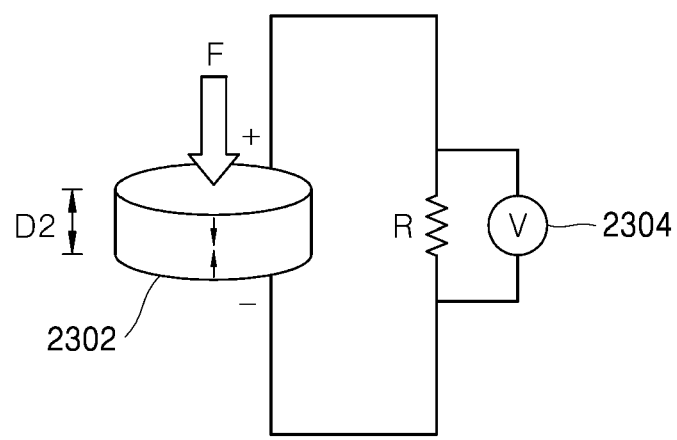
FIG. 22 is a view illustrating a state of the piezoelectric sensor when a force is applied in a direction of compressing the piezoelectric sensor.
Figure 23A:
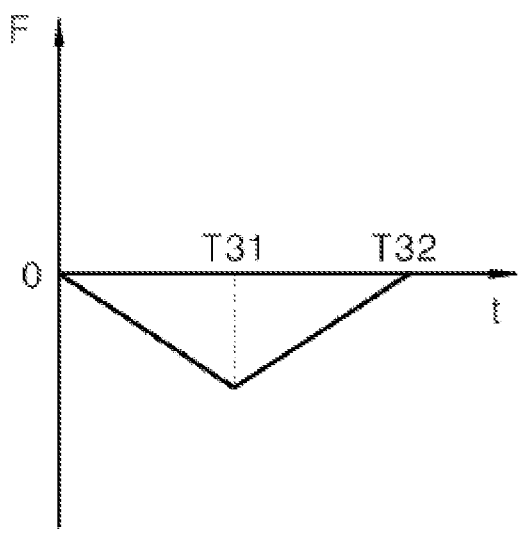
FIGS. 23A and 23B are graphs illustrating a level of the force applied to the piezoelectric sensor shown in FIG. 22 and a level of a voltage generated by the piezoelectric sensor.
Figure 23B:
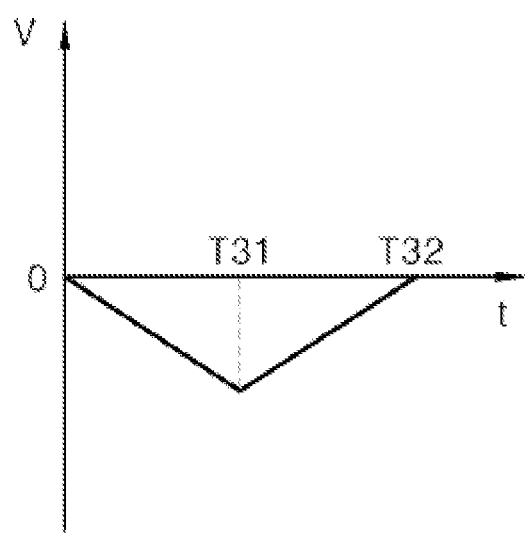

FIG. 22 is a view illustrating a state of the piezoelectric sensor when a force is applied in a direction of compressing the piezoelectric sensor. FIGS. 23A and 23B are graphs illustrating a level of the force applied to the piezoelectric sensor shown in FIG. 22 and a level of voltage generated by the piezoelectric sensor.

When a force F is applied to the piezoelectric sensor 2302 having the length D1 as shown in FIG. 20 in a direction of compressing the piezoelectric sensor 2302 from the outside as shown in FIG. 22, an electric field is formed at the piezoelectric sensor 2302 and a voltage is generated. For example, when the force F in the direction of compressing the piezoelectric sensor 2302 is increased through a section 0 to T31 as shown in FIG. 23A, a voltage level is also increased like a waveform of the section 0 to T31 shown in FIG. 23B.

In some examples, the piezoelectric sensor 2302 may have a positive pole + on top and a negative pole − on bottom based on FIG. 22. In FIG. 23B, a negative voltage value is shown according to the above-described polarity of the piezoelectric sensor 2302. The voltage value shows a maximum value at a point T31 when the piezoelectric sensor 2302 is compressed by a maximum length D2 by the force F from the outside.

In some implementations, after the point T31, when the force F in the direction of compressing the piezoelectric sensor 2302 is gradually decreased as shown in FIG. 23A, the level of the voltage generated by the piezoelectric sensor 2302 is gradually reduced as shown in FIG. 23B. Eventually, when the force F in the direction of compressing the piezoelectric sensor 2302 comes into 0, the level of the voltage generated by the piezoelectric sensor 2302 comes into 0.

Figure 24:
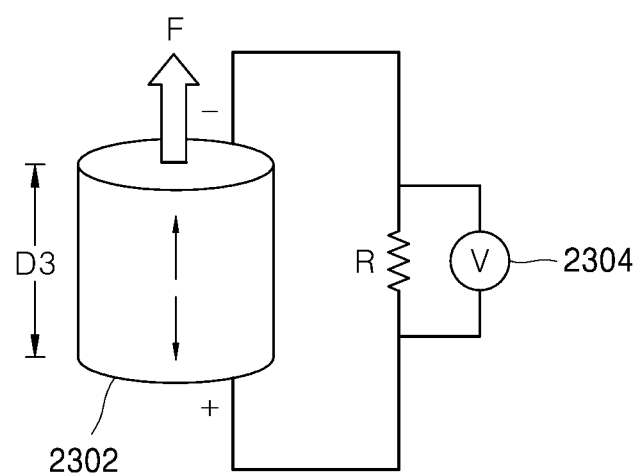
FIG. 24 is a view illustrating a state of the piezoelectric sensor when a force is applied in a direction of extending the piezoelectric sensor.
Figure 25A:
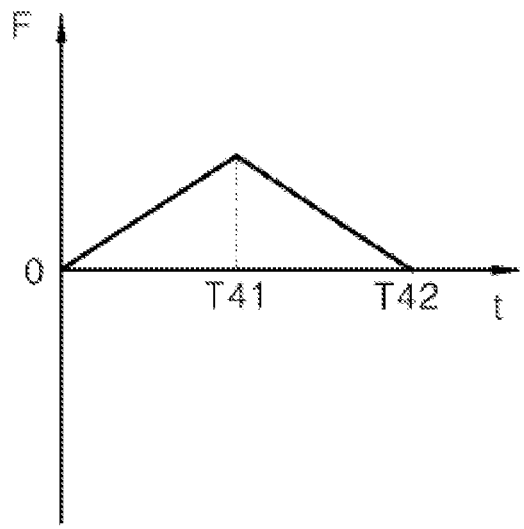
FIGS. 25A and 25B are graphs illustrating a level of the force applied to the piezoelectric sensor shown in FIG. 24 and a level of a voltage generated by the piezoelectric sensor.
Figure 25B:
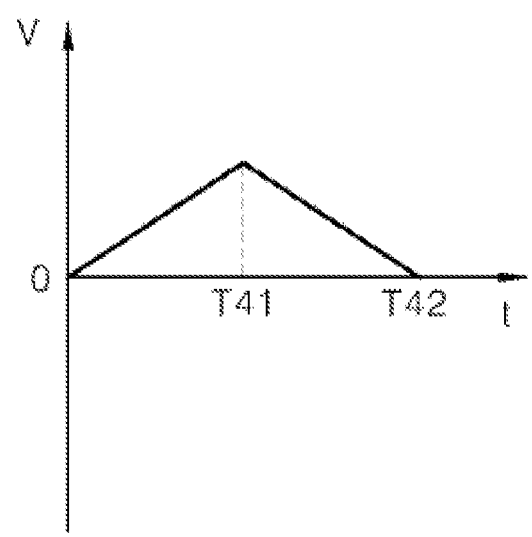

FIG. 24 is a view illustrating a state of the piezoelectric sensor when a force is applied in a direction of elongating the piezoelectric sensor. FIGS. 25A and 25B are graphs illustrating a level of the force applied to the piezoelectric sensor shown in FIG. 24 and a level of a voltage generated by the piezoelectric sensor.

When the force F is applied to the piezoelectric sensor 2302 having the length D1 as shown in FIG. 20 in a direction of elongating the piezoelectric sensor 2302 from the outside as shown in FIG. 24, an electric field is formed at the piezoelectric sensor 2302 and a voltage is generated. For example, when the force F in the direction of elongating the piezoelectric sensor 2302 is increased through a section 0 to T41 as shown in FIG. 25A, a voltage level is also increased like a waveform of the section 0 to T41 shown in FIG. 25B.

Here, the piezoelectric sensor 2302 has a negative pole − on top and a positive pole + on bottom based on FIG. 24. In other words, when the piezoelectric sensor 2302 is elongated, an electric field is formed in a direction opposite to the compression case. In FIG. 25B, a positive voltage value is shown according to the above-described polarity of the piezoelectric sensor 2302. The voltage value shows a maximum value at a point T41 when the piezoelectric sensor 2302 is elongated by a maximum length D3 by the force F from the outside.

In some implementations, after the point T41, when the force F in the direction of elongating the piezoelectric sensor 2302 is gradually decreased as shown in FIG. 25A, the level of the voltage generated by the piezoelectric sensor 2302 is gradually reduced as shown in FIG. 25B. Eventually, when the force F in the direction of elongating the piezoelectric sensor 2302 comes into 0, the level of the voltage generated by the piezoelectric sensor 2302 comes into 0.

As described with reference to FIGS. 20 to 25B, the piezoelectric sensor 2302 has a feature of generating a voltage when compressed or elongated by a force applied from the outside. In some implementations, the polarity of the piezoelectric sensor 2302 has a feature of being shown opposite when compressed and elongated. In some implementations, touch operations of the user, for example, a push operation and a release operation are sensed using the above-described feature of the piezoelectric sensor 2302.

For reference, in FIGS. 23B and 25B, a voltage generated when the piezoelectric sensor 2302 is compressed is shown as a negative value and a voltage generated when the piezoelectric sensor 2302 is elongated is shown as a positive value, respectively. However, depending on implementations, a positive voltage value may be shown in compression and a negative voltage value may be shown in elongation.

Figure 26:
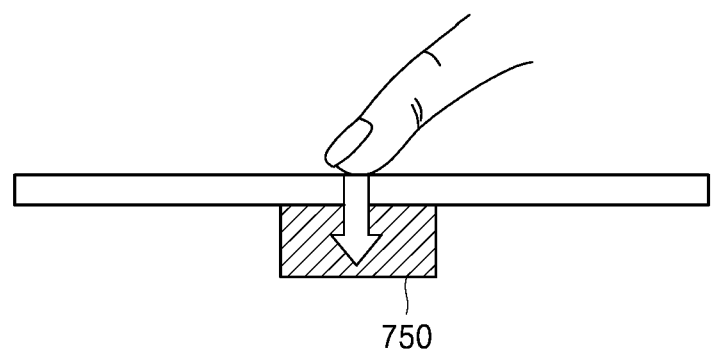
FIG. 26 is a view illustrating an example push operation of touch operations.
Figure 27:
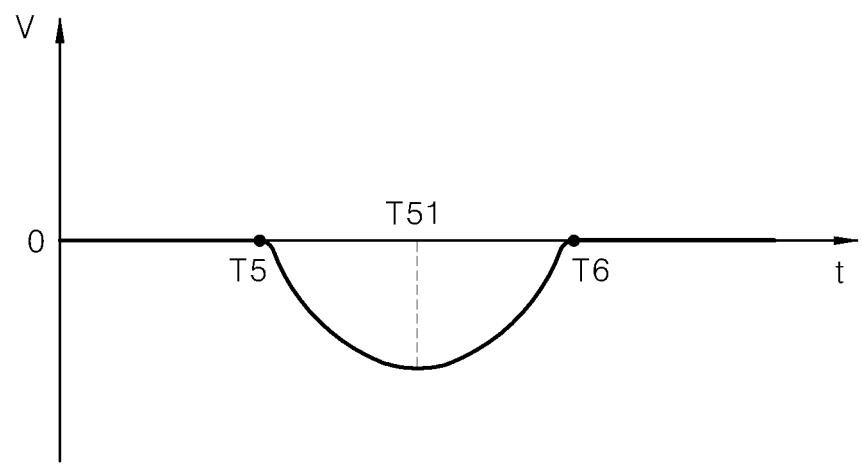
FIG. 27 is a graph illustrating an example waveform of a voltage generated by a sensor portion due to the push operation.

FIG. 26 is a view illustrating an example push operation among touch operations. FIG. 27 is a graph illustrating a waveform of a voltage generated by the sensor portion due to the push operation among touch operations.

As shown in FIG. 26, a touch operation is started as the user touches a substrate 2602 with a part of body, for example, a finger at a position corresponding to the sensor 750. The user performs the touch operation by pushing the sensor 750 by applying a force at a certain level thereto with the finger that touches.

In some implementations, an operation of the user from a point in time when the user touches the substrate 2602 with a part of body to a point in time when the user applies a pressure at a certain level to the substrate 2602 and then the applied pressure is stabilized is defined as a push operation.

According to the level of the force applied to the sensor 750 in the above-described push operation, a voltage is generated by the sensor 750, for example, a piezoelectric sensor. Referring to FIG. 27, in a section 0 to T5 in which the user does not touch the substrate 2602 with the finger, since the sensor 750 does not generate a voltage, a voltage value is shown as 0.

After that, at a point T5, as the user touches the substrate 2602 with the finger and increases a force applied to the sensor 750, the sensor 750 generates a voltage. Here, since the sensor 750 is compressed by the force of the user, the voltage generated by the sensor 750 has a negative value (refer to FIGS. 22 and 23B). In FIG. 27, a point T51 indicates a point when the force applied by the user comes into a maximum value.

After that, the user naturally reduces the force while the finger is in contact with the substrate 2602. Accordingly, a level of the voltage generated by the sensor 750 from the point T51 where the user starts reducing the force to a point T6 where the user maintains the force and the force gets stabilized increases to 0 again. For example, even though the voltage level at the point T6 where the force gets stabilized is shown as 0 in FIG. 27, since the user may continuously apply a certain force to the substrate 2602 depending on implementations, the voltage level at the point T6 may be shown smaller than 0.

In some implementations, a touch operation of the user that occurs through a section T5 to T6 shown in FIG. 27 is defined as a push operation. Accordingly, the point T5 becomes a start point of the push operation and the point T6 becomes an end point of the push operation.

Figure 28:
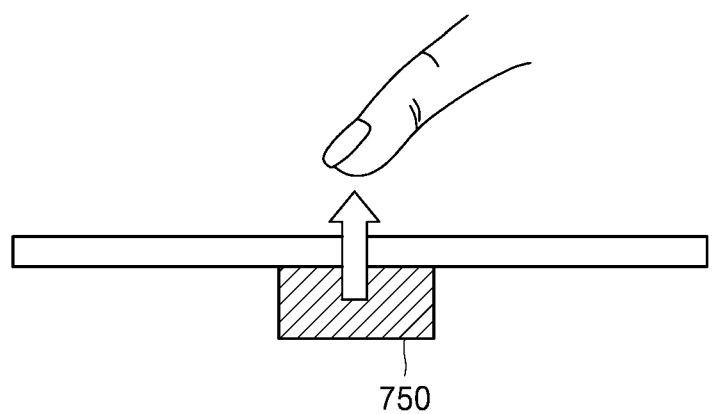
FIG. 28 is a view illustrating an example release operation of touch operations.
Figure 29:
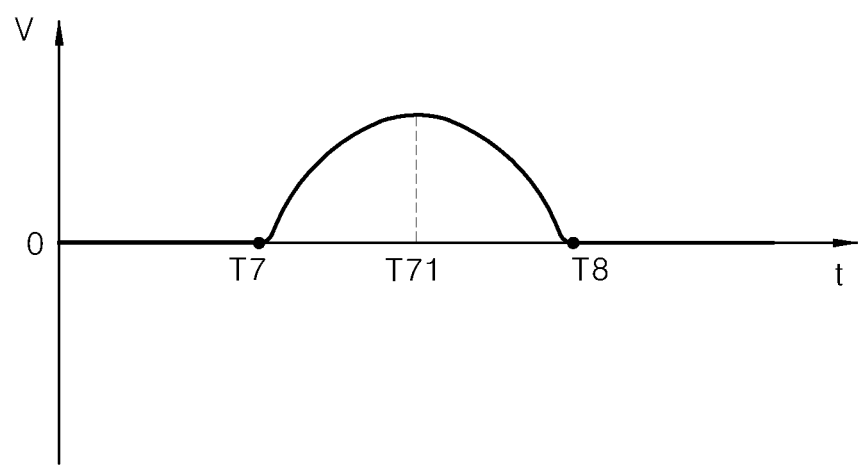
FIG. 29 is a graph illustrating an example waveform of a voltage generated by the sensor portion due to the release operation.

FIG. 28 is a view illustrating a release operation among touch operations. FIG. 29 is a graph illustrating a waveform of a voltage generated by the sensor portion due to the release operation among touch operations.

As described with reference to FIGS. 26 and 27, the user touches the substrate 2602 with the finger and then applies a certain force thereto. After that, the user completely removes the finger in contact with the substrate 2602 from the substrate 2602. Here, the above-described operation is referred to as a release operation.

As shown in FIG. 28, when the user applies the force to the substrate 2602 and then removes the finger from the substrate 2602, the sensor 750 compressed by the force applied to the substrate 2602 as described above is instantaneously elongated due to a reaction. That is, due to an operation in which the user removes the finger that is pushing the substrate 2602, for example, a release operation, the sensor 750 rapidly changes from a compression state as shown in FIG. 22 into an elongation state as shown in FIG. 24. The sensor 750 elongated as described above is gradually restored to an original size and returns to a stable state as shown in FIG. 20.

As the sensor 750 is instantaneously elongated by the above-described release operation of the user, a voltage is generated. Referring to FIG. 29, in a stable section 0 to T7 in which the user touches the substrate 2602 with the finger as the above-described push operation, the sensor 750 shows a stable voltage value, for example, 0. For example, as described above, the voltage value in the stable section 0 to T7 may be shown smaller than 0 depending on a force applied by the user.

After that, when the user removes the finger from the substrate 2602 at the point T7, the sensor 750 is instantaneously elongated and accordingly generates a voltage. Here, since the sensor 750 receives a force in a direction opposite to that of compression, for example, a direction of elongation, the voltage generated by the sensor 750 shows a positive value (refer to FIGS. 24 and 25B). In FIG. 29, a point T71 indicates a point where the force applied to the sensor becomes a maximum value due to elongation.

After the point T71, the force applied to the sensor 750 is gradually reduced and the length of the sensor 750 is also gradually reduced. Accordingly, a level of a voltage generated by the sensor 750 from the point T71 where the force applied to the sensor 750 starts being reduced to a point T8 where the force applied to the sensor 750 completely dissipates is reduced to 0 again.

In some implementations, the touch operation of the user that generates the voltage shown in a section T7 to T8 shown in FIG. 29 is defined as a release operation. Accordingly, the point T7 becomes a start point of the release operation and the point T8 becomes an end point of the release operation.

Figure 30A:
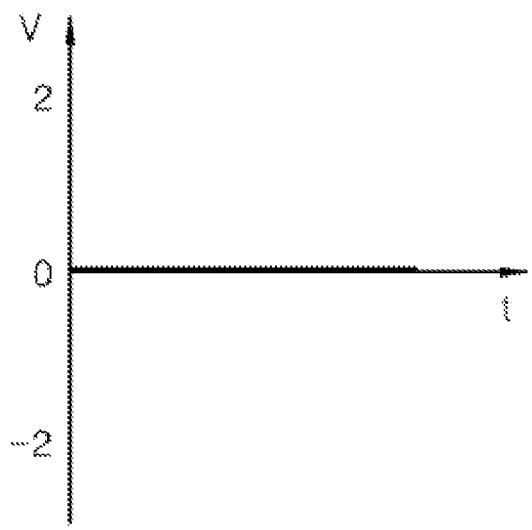
FIGS. 30A and 30B illustrate waveforms of input signals input to a conventional sensor controller.
Figure 30B:
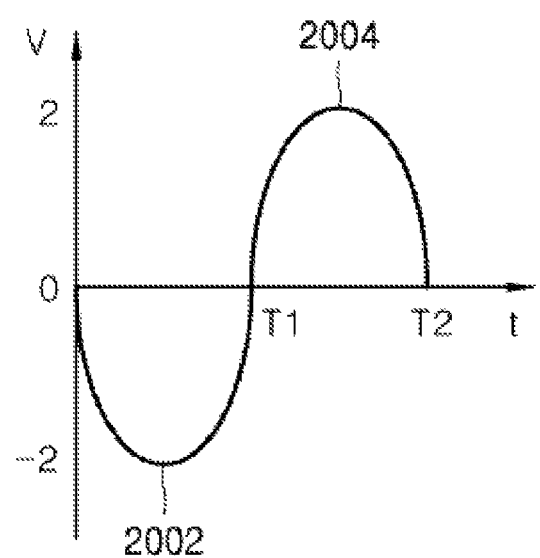

FIGS. 30A and 30B illustrate waveforms of input signals input into a conventional sensor controller.

FIG. 30A illustrates a voltage waveform of an input signal when a user does not touch a touch portion, and FIG. 30B illustrates a voltage waveform of an input signal when the user touches the touch portion. As shown in FIG. 30A, the input signal when the user does not touch the touch portion is shown 0 V.

When the user touches the touch portion while the input signal maintains 0 V as shown in FIG. 30A, a change in voltage waveform of the input signal occurs as shown in FIG. 30B. Touch operations of the user may be divided into two operations, namely, a push operation and a release operation. The push operation means an operation in which the user touches the touch portion with a part of body, for example, a finger. The release operation means an operation in which the user removes the part of body, for example, the finger in contact with the touch portion due to the push operation from the touch portion.

For example, when the user performs the push operation and touches the touch portion with the finger, a waveform 2002 as shown in a section 0 to T1 of FIG. 30B occurs. Here, a point 0 is a point where the user starts touching the touch portion with the finger and a point T1 is a point where the user starts removing the finger from the touch portion, namely, starts the releasing operation. As shown in FIG. 30B, when the user touches the touch portion with the finger and applies a pressure (the push operation), a voltage value of the input signal is temporarily shown smaller than 0 as the waveform 2002.

After that, when the user removes the finger from the touch portion at the point T1 (the release operation), a waveform 2004 as shown in a section T1 to T2 of FIG. 30B occurs. In FIG. 30B, the point T1 is a point where the user starts removing the finger from the touch portion, namely, the release operation is started and the point T2 is a point where the voltage of the input signal gets stabilized as 0 V again after the user performs the release operation. As shown in FIG. 30B, during the release operation, the voltage value of the input signal is temporarily shown greater than 0 like the waveform 2004.

However, it is impossible for the conventional sensor controller to sense the waveform 2002 corresponding to an input signal that indicates a voltage value smaller than 0, namely, the push operation among the waveforms as shown in FIG. 30B. This is because the conventional sensor controller may not sense the voltage value smaller than 0. In other words, since the conventional sensor controller may not sense the voltage value smaller than 0, a touch operation corresponding to the input signal that indicates the voltage value smaller than 0 may be completely not sensed. Accordingly, according to the conventional sensor controller, even when the user touches the touch portion with the finger, it is impossible to sense the touch and to control corresponding thereto.

Figure 31A:
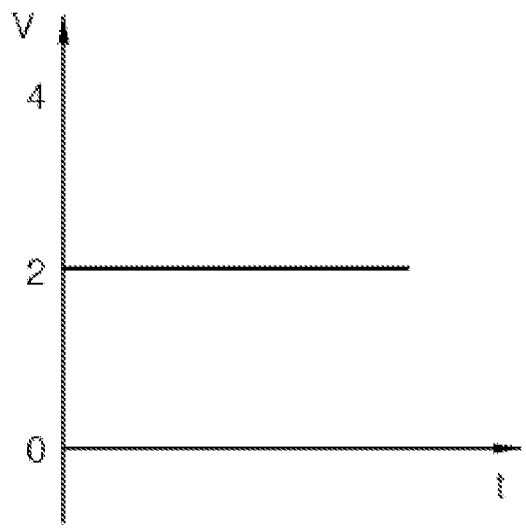
FIGS. 31A and 31B illustrate waveforms of input signals input into the sensor controller according to one implementation of the present disclosure.
Figure 31B:
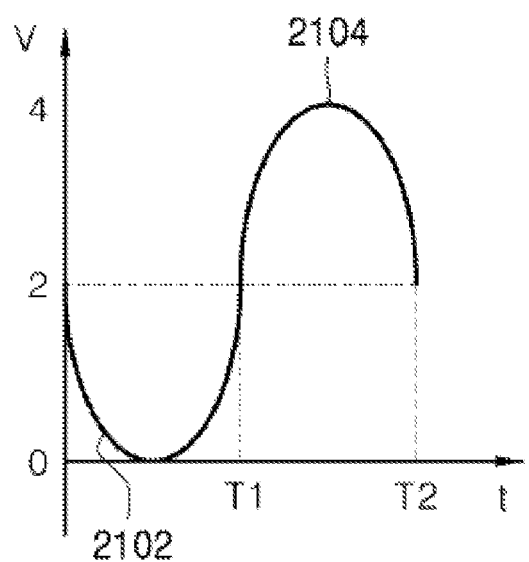

FIGS. 31A and 31B illustrate waveforms of input signals input into the sensor controller.

FIG. 31A illustrates a voltage waveform of an input signal when a user does not touch the touch portion 12, and FIG. 31B illustrates a voltage waveform of an input signal when the user touches the touch portion 12. In FIG. 31B, a point 0 refers to a point in time when a push operation of the user is started and a point T1 refers to a point in time when a release operation of the user is started. In addition, a point T2 refers to a point in time when a voltage value of the input signal gets stabilized after the release operation of the user is completed.

As shown in FIG. 31A, even when the user does not touch the touch portion 12 with the finger, a signal having an arbitrary voltage value, for example, 2 V is output through the amplification circuit 1804 included in the sensor controller 314. This is because the amplification circuit 1804 remains in a floating state due to the disposition of the fourth resistor R4 of the amplification circuit 1804 as described above with reference to FIG. 18. In some implementations, the voltage value, for example, 2 V of the input signal shown when the user does not touch the touch portion 12 as shown in FIG. 31A may be defined as a reference operation voltage value.

After that, when the user touches the touch portion 12, a voltage waveform as shown in FIG. 31B occurs. That is, the voltage value of the input signal is decreased to be a first operation voltage value, for example, 0 V or less like a waveform 2102 due to the push operation of the user. In some implementations, the voltage value of the input signal is increased to be a second operation voltage value, for example, 4 V or more like a waveform 2104 due to the release operation in which the user removes the finger from the touch portion 12.

In some examples, all the voltage values of the input signals shown by the push operation and the release operation may be set to be greater than 0. When the voltage values of the input signals shown by the push operation and the release operation are set to be greater than 0, even though the sensor controller 314 can not sense a voltage value smaller than 0, there is no problem in individually sensing the push operation and the release operation. For the above-described sensing of the operations, the first operation voltage value may be set to be 0 or more.

In some implementations, the reference operation voltage value may be arbitrarily set by the user but may be set to be greater than 0. In some implementations, the reference operation voltage value may be set as an average value between the first operation voltage value and the second operation voltage value.

In some implementations, the sensitivity of a touch sensor may be increased by amplifying a level of an input signal generated according to a degree of applying a pressure to the touch sensor and it is possible to perform precise control.

In some implementations, a sensing speed of a touch operation of a user and a response speed of the touch operation may be increased by sensing both an operation in which the user pushes an operation area (e.g., a push operation) and an operation in which the user removes a finger from the pushed operation area (e.g., a release operation).

Since the above-described implementations of the present disclosure may be variously substituted, modified, and changed by one of ordinary skill in the art without departing from the scope of the technical concept of the present disclosure, the present disclosure is not limited to the above-described implementations and the attached drawings.

What is claimed is:
1. A refrigerator comprising:
a door including a front panel that defines at least a portion of an exterior of the refrigerator, the front panel including an operation area configured to receive a touch operation of a user;
a touch sensor assembly located in the door rearward of the operation area, the touch sensor assembly including a plurality of sensors and being configured to generate an input signal based on the touch operation; and
a sensor controller connected to the touch sensor assembly and configured to process the input signal received from the touch sensor assembly,
wherein the sensor controller is configured to determine that the touch operation is a push operation based on determination that a voltage value of the processed input signal is less than or equal to a predetermined first threshold voltage value,
wherein the sensor controller is configured to determine that the touch operation is a release operation based on determination that the voltage value of the processed input signal is greater than or equal to a predetermined second threshold voltage value,
wherein the sensor controller comprises an amplification circuit configured to receive the input signal from the touch sensor assembly and amplify the input signal by a predetermined amplification ratio, and
wherein the amplification circuit comprises:
a differential amplifier,
a first resistor connected to a positive terminal of the differential amplifier,
a second resistor connected to an output terminal of the differential amplifier and a negative terminal of the differential amplifier,
a third resistor connected to the negative terminal of the differential amplifier and a reference power supply, and a fourth resistor having one end connected to a first point between the first resistor and the positive terminal and the other end connected to a second point between the reference power supply and the third resistor.

2. The refrigerator of claim 1, wherein a ratio of resistance values of the second and third resistors determines the predetermined amplification ratio of the amplification circuit.

3. The refrigerator of claim 1, wherein a ratio of resistance values of the first and fourth third resistors equals to a ratio of resistance values of the third and second resistors.

4. The refrigerator of claim 1, wherein the fourth resistor determines a predetermined reference operation voltage value based on the sensor controller receiving no input signal from the touch sensor assembly.

5. The refrigerator of claim 1, wherein the sensor controller further comprises a filtering circuit that is connected to the output terminal of the differential amplifier and that is configured to attenuate a noise signal from the amplified input signal, and
wherein the filtering circuit includes a fifth resistor that is connected to the output terminal of the differential amplifier and a capacitor connected to the fifth resistor and a ground terminal.

6. The refrigerator of claim 1, wherein the sensor controller further comprises a voltage follower circuit that is connected to the first resistor of the amplification circuit, that is configured to receive the input signal through a positive terminal of the voltage follower circuit, and that is configured to transmit the input signal to the amplification circuit through an output terminal of the voltage follower circuit.

7. The refrigerator of claim 6, wherein the output terminal of the voltage follower circuit is connected to a negative terminal of the voltage follower circuit.

8. The refrigerator of claim 1, wherein the sensor controller comprises a voltage follower circuit configured to amplify power of the input signal.

9. The refrigerator of claim 8, wherein the voltage follower circuit is configured to amplify a current value of the input signal and to maintain a voltage value of the input signal.

10. The refrigerator of claim 1, wherein each sensor of the plurality of sensors includes a piezoelectric member configured to deform to generate the input signal based on the touch operation.

11. The refrigerator of claim 10, wherein the piezoelectric member is configured to increase a voltage level of the input signal based on an increase of compression and elongation of the piezoelectric member.

12. The refrigerator of claim 11, wherein the piezoelectric member is configured to decrease the voltage level of the input signal based on a decrease of compression and elongation of the piezoelectric member.

13. The refrigerator of claim 1, wherein the amplification circuit is configured to output a predetermined reference operation voltage value based on receiving no input signal from the touch sensor assembly.

14. The refrigerator of claim 13, wherein the reference operation voltage value is greater than zero.

15. The refrigerator of claim 13, wherein the amplification circuit is configured to, based on a sensor of the plurality of sensors receiving a pressure from the operation area, output a first voltage value that is less than the reference operation voltage value.

16. The refrigerator of claim 15, wherein the amplification circuit is configured to, based on the sensor being released from the pressure, output a second voltage value greater than the reference operation voltage value.

17. The refrigerator of claim 13, wherein the reference operation voltage value is an average value of the first and second threshold voltage values.

18. The refrigerator of claim 17, wherein the first threshold voltage value is less than the second threshold voltage value.

* * * * *